United States Patent [19]

Warrender

[11] 4,429,609

[45] Feb. 7, 1984

[54] PITCH ANALYZER

[76] Inventor: David J. Warrender, 2685 Burnside Rd., Sebastopol, Calif. 95472

[21] Appl. No.: 345,441

[22] Filed: Feb. 3, 1982

Related U.S. Application Data

[63] Continuation-in-part of Ser. No. 330,681, Dec. 14, 1981.

[51] Int. Cl.[3] .......................... G10G 7/02; G01R 23/02

[52] U.S. Cl. .................................... 84/454; 84/477 R; 324/78 D

[58] Field of Search ................. 84/454, 470 R, 477 R, 84/DIG. 18; 324/78 D, 78 Z, 79 D, 77 G; 381/38, 49

[56] References Cited

U.S. PATENT DOCUMENTS

| | | | |
|---|---|---|---|
| 4,028,985 | 6/1977 | Merritt | 84/454 |
| 4,217,808 | 8/1980 | Slepian | 84/454 |
| 4,271,746 | 6/1981 | Dobbie | 84/454 |
| 4,351,216 | 9/1982 | Hamm | 84/454 |
| 4,354,418 | 10/1982 | Moravec | 84/454 |

OTHER PUBLICATIONS

WO81/01898, Roses, Jul. 1981, WIPO.

*Primary Examiner*—William B. Perkey
*Attorney, Agent, or Firm*—Townsend and Townsend

[57] ABSTRACT

Device and method for measuring the pitch of a musical sound and displaying the pitch and the pitch error. The device consists of analog signal processing circuitry and digital computing and display circuitry. The analog signal processing circuitry accepts a signal from an appropriate signal source, amplifies the signal if necessary, removes those frequency bands which are outside the area of interest, and generates a digital reference signal which represents zero-crossings of the analog signal. The digital computing circuitry performs an analysis using the zero-crossing time data and determines the fundamental pitch of the input signal. This is accomplished by, in effect, delaying the digital reference signal by successive amounts corresponding to the intervals between zero crossings, and correlating the effectively delayed signals with the digital reference signal. A high correlation corresponds to a delay which is near an integer number of periods. Additionally, the digital computing circuitry converts the pitch information into appropriate display driving signals which are buffered if necessary before they are applied to the display device itself.

15 Claims, 7 Drawing Figures

PITCH ANALYZER

The application is a continuation-in-part of copending U.S. Application Ser. No. 330,681, filed Dec. 14. 1981, for "PITCH ANALYZER".

FIELD OF THE INVENTION

The present invention relates generally to signal analysis and more specifically to pitch analysis for musicians.

BACKGROUND OF THE INVENTION

The analysis and display of musical pitch information can provide invaluable feedback for musicians, singers, and the like. To better understand the present invention, it is necessary to define clearly what is meant by musical pitch. All musical sounds which have a perceivable pitch consist of a sound pressure waveform that is periodic in time. The simplest periodic waveform is the sine wave. Any number of harmonics (sine waves with frequencies which are integer multiples of the fundamental frequency) may be added to the basic sine wave to give a very complex waveform in the time domain. Even though these harmonics are present, we still perceive the pitch of the sound as the fundamental frequency of the waveform. In fact, if the fundamental frequency of a musical sound is weak or missing altogether, the human mechanism of pitch detection is able to infer the fundamental pitch from the harmonics that are present. Simple pitch measuring devices which are based in the frequency domain respond to all the frequencies present in the waveform and often yield ambiguous results. Even if a method is used to display the lowest frequency present, this frequency may not be the perceived pitch of the sound if the energy of the component at the fundamental frequency is much weaker than several of the harmonics.

A much better method of extracting the preceived pitch is to measure the period of time over which the waveform is periodic. This technique seems to more closely model the human mechanism of pitch detection. There are, however, pitfalls in this method. First, in naturally occurring acoustic sounds the frequency of the overtones or partials are often not exact multiples of the fundamental frequency, and therefore cannot accurately be called harmonics. This inexactness results in such waveforms having a dynamically changing structure in the time domain with the phase of the overtones constantly changing with respect to the phase of the fundamental frequency. Thus the shape of the waveform may be completely altered over a span of several cycles, while the shape of adjacent cycles remains quite similar. In addition, the overtone structure of musical sounds often changes dramatically over a relatively short period of time, especially in the case of human voice. This again causes the shape of the waveform to change over a span of several cycles.

Further complicating the measurement problem is the fact that naturally occurring acoustic waveforms tend to be modulated by random fluctuations in amplitude. Periodic amplitude and frequency fluctuations may also be present; i.e., tremolo and vibrato. The human singing voice usually has all three of these effects present to some degree.

No previous pitch measurement method has addressed all of these problems successfully. Many have realized the shortcomings of operating in the frequency domain and have chosen to attempt to measure the period of the waveform in the time domain. Most methods, such as Merrit in U.S. Pat. No. 4,028,985, and Slepian and Weldon in U.S. Pat. No. 4,217,808 rely on detecting amplitude peaks of the periodic waveform. There are several weaknesses to peak detection approaches. First, acoustic waveforms rich in overtones may have several peaks in one cycle, with the shape and amplitude of these peaks constantly changing as indicated in the above paragraphs. Thus, the peak that is detected in one cycle may not correspond to the peak in an adjacent cycle and gross measurement errors will result. Similarly, rapid random or periodic amplitude fluctuations may cause a peak to be missed or cause minor peaks to be mistaken for the major peak. Even if peaks are not missed, small amplitude variations may translate into substantial time measurement errors, since a waveform typically has a gentle slope near its peak.

In addition, most techniques that use the amplitude of the waveform require an Automatic Gain Control (AGC) circuit to accommodate changes in input signal level. To avoid distortion of the waveform, AGC circuits are designed to have a fast attack time and slow decay time. This prevents the circuits from tracking small rapid changes in amplitude present in naturally occurring acoustic waveforms. In normal audio applications this is not a problem, since the sound is judged only by the human ear which is not sensitive to moderate amplitude changes. However, small amplitude changes can cause peak detectors to make gross errors. Reducing the AGC decay time allows the circuit to track more rapid amplitude fluctuations, but causes level-dependent distortion of low frequency waveforms. To minimize these difficulties either the range of pitches that can be measured must be limited, or some means must be provided for adjusting the time constant of the AGC in concert with the incoming pitch.

It is a known technique to analyze frequency by measuring the times at which the waveform crosses zero. The zero-crossings of a waveform are completely unaffected by the waveform amplitude. While this technique is suitable for relatively pure tones, it presents problems for a waveform which may cross zero several times during a cycle. While some sort of filtering scheme can be used to remove the overtones so that only two zero crossings occur in one cycle, this requires either operator intervention or an automatic filtering scheme which would have all the undesireable characteristics of an AGC circuit. Thus, while the known zero-crossing technique avoids the problems presented by the peak amplitude technique, it is itself subject to other problems.

SUMMARY OF THE INVENTION

The present invention provides a device and method for measuring the pitch of a musical sound and displaying the pitch and the pitch error in a complete and intuitively clear way with sufficient accuracy and speed that a musician or a singer can learn pitch discrimination by using the device for immediate feedback of pitch information.

A device according to the present invention consists of two distinct sections: the analog signal processing circuitry and the digital computing and display circuitry. The analog signal processing circuitry accepts a signal from an appropriate signal source, amplifies the signal if necessary, removes those frequency bands which are outside the area of interest, and generates a digital reference signal which represents zero-crossings of the analog signal. The digital computing circuitry performs an analysis using the zero-crossing time data and determines the fundamental pitch of the input signal. This is accomplished by, in effect, delaying the digital reference signal by successive amounts corresponding to the intervals between zero crossings, and correlating the effectively delayed signals with the digital reference signal. A high correlation corresponds to a delay which is near an integer number of periods. Additionally, the digital computing circuitry converts the pitch information into appropriate display driving signals which are buffered if necessary before they are applied to the display device itself.

This invention measures the pitch of an audio frequency signal and displays the said pitch accurately and rapidly on a display that is easily read and interpreted by an untrained operator. The measurement and display of pitch are fully automatic and require no operator adjustment or intervention during use. The pitch may be measured over a range of at least seven octaves, with the display precision remaining consistent with respect to an equally tempered musical scale. By way of contrast, in techniques which use beat notes, a given pitch error yields a beat frequency which is proportional to the pitch of the note. The pitch is preferably displayed as an illuminated note on a musical staff with separate indicators for octave displacement and error. This display of pitch is easy to interpret and is intuitively natural to a musician. The display is updated frequently enough to give the operator the impression of immediate response to pitch change. The apparatus recognizes a musical sound having a perceived pitch and blanks the display for all other inputs. Thus, transient noise or otherwise erroneous data only cause the display to blank momentarily and do not adversely affect succeeding measurement. The apparatus accurately measures the perceived pitch of a large variety of acoustically generated sounds. The sound may contain any number of overtones. The frequency of the overtones may depart from exact integer multiples of the fundamental frequency and the fundamental frequency may be weak or absent altogether. The sound may also cover a wide range of amplitudes and the amplitude may vary randomly or periodically at a rapid rate without affecting the accuracy of the pitch measurement.

For a further understanding of the nature and advantages of the present invention, reference should be made to the remaining portions of the specifications and to the attached drawings.

DETAILED DESCRIPTION OF THE INVENTION

Figure 1:
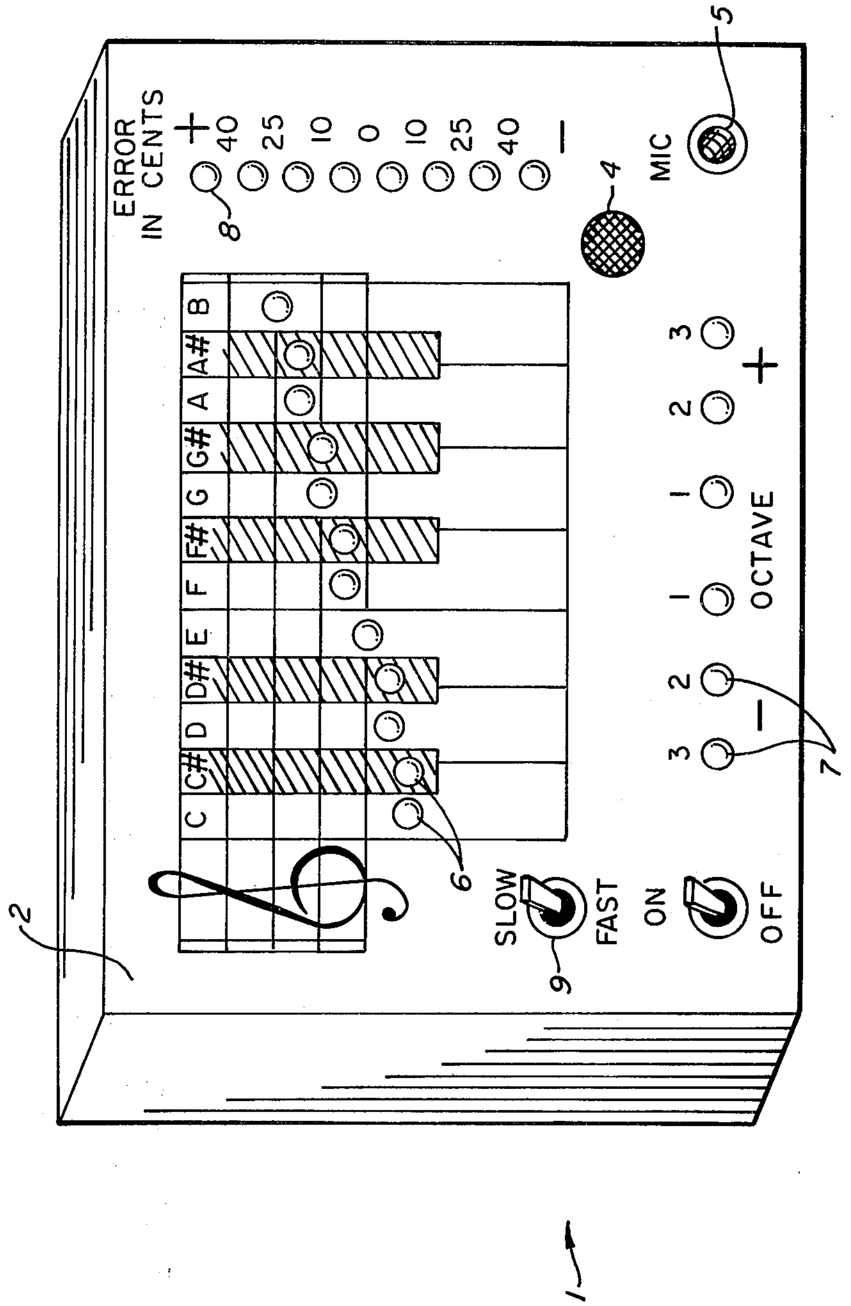
FIG. 1 is a drawing showing the external appearance of the preferred embodiment of the pitch analyzer.

FIG. 1 is an oblique view illustrating the external appearance of a Pitch Analyzer 1. Broadly, Analyzer 1 includes system electronics (to be described below) which are housed within a cabinet 2 and has as its purpose the analysis and display of musical pitch information. A musical tone is sensed by a built-in Microphone 4 and converted to an electrical signal. Alternately, Microphone 4 may be overridden by plugging an external microphone or electric instrument into an Input Jack 5. The display includes a first array of LED indicators 6, a second array of LED indicators 7, and a third array of LED indicators 8. Digital averaging may be selectively incorporated by manipulating a Selector Switch 9.

LED indicators 6 correspond to the notes within the musical scale. They are horizontally registered to a graphic representation of a piano keyboard while they are vertically registered relative to a graphic representation of a musical staff. LED indicators 7 correspond to the octave displacement from the octave beginning at middle C. In the preferred embodiment, notes up to three octaves below middle C, or three octaves above the B above middle C may be displayed. LED indicators 8 provide an indication of the degree to which the input note varies from the nearest standard equally tempered note.

Figure 2:
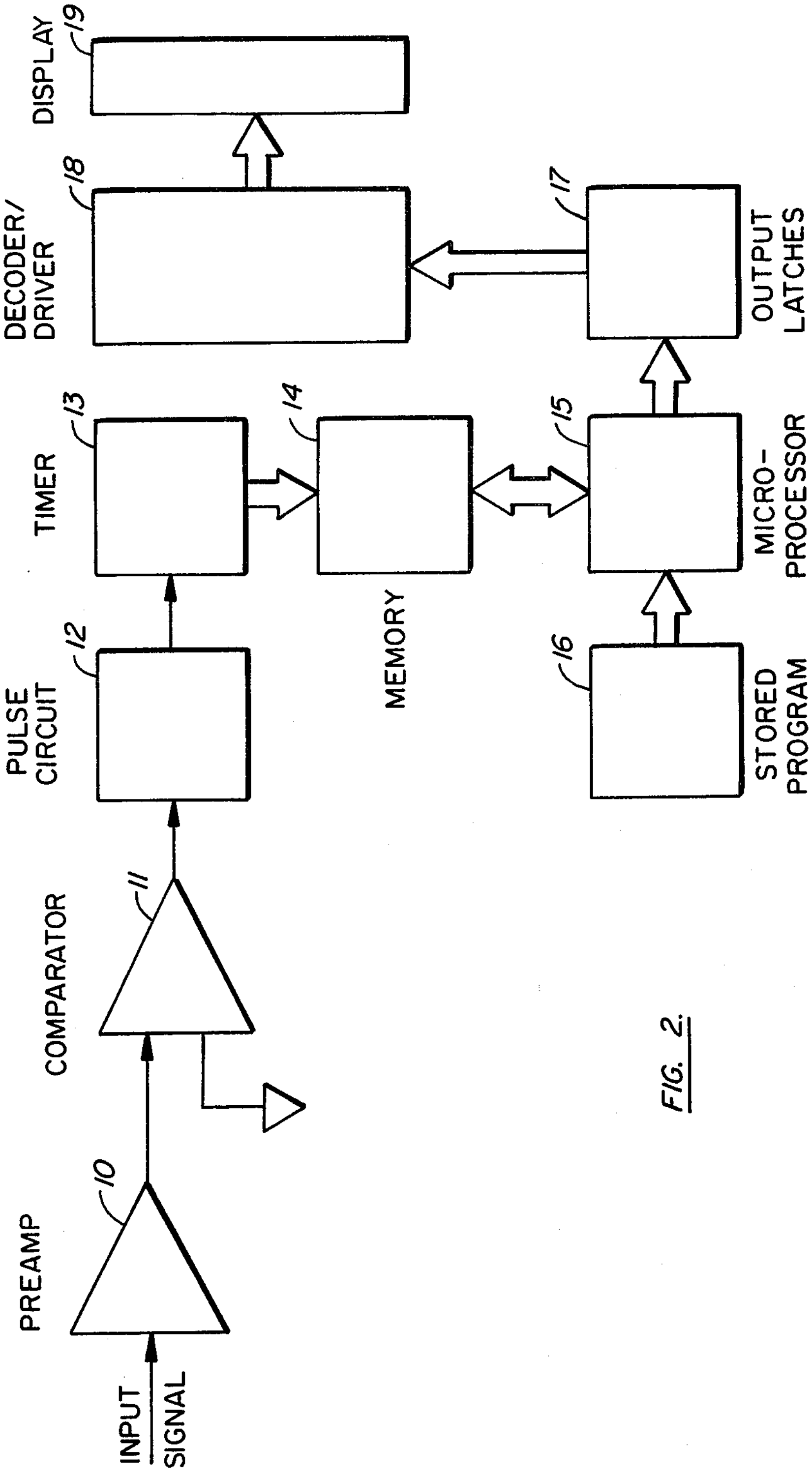
FIG. 2 is a functional block diagram which illustrates the functional elements necessary to perform the pitch analysis.

FIG. 2 shows the essential blocks that comprise the system circuitry of analyzer 1. The input signal from a microphone, instrument pickup, or other appropriate signal source is processed by the Preamp 10, Comparator 11, and Pulse Circuit 12 which produces a pulse every time the input signal crosses zero. The Timer 13 measures the times of the zero-crossings of the input signal as represented by pulses from the Pulse Circuit 12, and stores these time values in the Memory 14. The actual pitch determination is made by the Microprocessor 15 which analyzes the time values stored in the Memory 14. The Microprocessor 15 performs this analysis by executing the Stored Program 16. The results of the analysis, in the form of a number or numbers representing the value of the pitch, are stored in the Output Latches 17. The Decoder/Driver 18 and Display 19 (which includes LED indicators 6, 7, and 8) convert the pitch data into information understandable by the operator.

The first block, the Preamp 10, has as its input an electrical signal which may be periodic and have a pitch in the range of interest. The signal source can be a microphone, transducer, or any other generator of an appropriate electrical signal. The Preamp 10 amplifies the signal and removes any frequencies outside the pitch range of interest.

Figure 4:
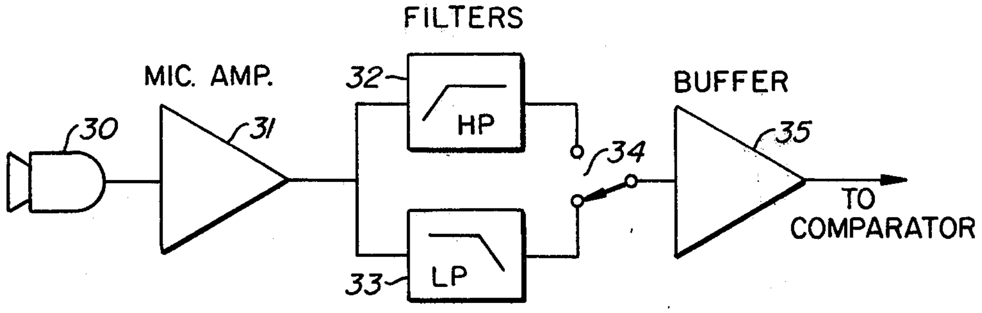
FIG. 4 is a detailed diagram of the preferred embodiment of the Preamp.

FIG. 4 shows in detail the preferred embodiment of the Preamp 10 block. The input signal is from the Microphone 30 and is amplified by the Microphone Amplifier 31. The signal is then sent to a High-Pass Filter 32 and Low-Pass Filter 33, one of which is selected by the Microprocessor 15 by means of the Switch 34. Which filter is chosen is based on which yields the best pitch data. The Low-Pass Filter 33 is used to remove the higher frequencies from spectrally rich bass notes. The High-Pass Filter 32 is used to remove low frequency power line interference and random low frequency fluctuations superimposed on middle and high frequency notes. The Buffer 35 further amplifies the signal and completes the Preamp function.

The output of the Preamp 10 is connected to the Comparator 11, which generates a digital reference signal which is high when the input signal is above zero and low when below zero. In the preferred embodiment a very small amount of hysteresis is used in the Comparator to ensure sharp, non-oscillating transistions.

Figure 5:
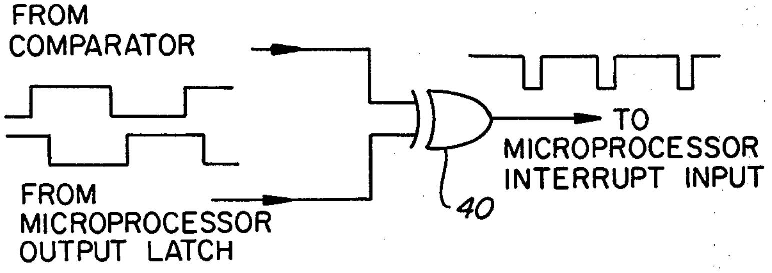
FIG. 5 is a functional diagram of the preferred embodiment of the Pulse Circuit.

The output of the Comparator 11 is connected to a Pulse Circuit 12 which generates a pulse at each zero-crossing. The exact nature of the pulse will be determined by the implementation chosen for the Timer 13 which measures the zero-crossing times. For a timer implemented in hardware, a mono-stable multivibrator triggered by both the negative and positive going transistions of the signal would be an appropriate Pulse Circuit. FIG. 5 shows the preferred form for the preferred embodiment where the Timer 13 is implemented as part of the Stored Program 16 used by the Microprocessor 15. The output of the Comparator 11 is tied to one input of an exclusive OR gate 40 while the output is tied to the Microprocessor Interrupt Input. Upon reception of the interrupt the Microprocessor 15 acknowledges it by changing the state of the second input of the exclusive OR gate via a Microprocessor Output Latch, causing the pulse to be terminated, making the Pulse Circuit ready for the next zero-crossing.

The Timer 13, is used to measure the time of each zero-crossing of the signal and takes the form of a counter which outputs the value of its count to the Memory 14 whenever a pulse arrives from the Pulse Circuit 12. A means must also be provided to stop the acquisition of data when the desired number of zero-crossing times have been recorded in the Memory 13. The number of zero-crossing times must be large enough so at least two cycles of the input waveform are represented but not so large that the waveform at the beginning of the sample period is substantially different from the waveform at the end.

In the preferred embodiment, which implements the timer by means of the Microprocessor 15 executing a section of the Stored Program 16, a number stored in the Memory 14 is incremented at a precise rate related to the Microprocessor 15 clock frequency. When an interrupt occurs due to a zero-crossing, the value of this number, which represents the time of the zero-crossing, is stored in a list in another section of the Memory 14. Each time an interrupt occurs the counter stops and the counts lost during the servicing of the interrupt must be accounted for. The total of the number of counts lost is therefore kept and added to each time value before it is saved in the Memory.

Once the zero-crossing time data has been stored in a list in the Memory 14, the Microprocessor 15 performs an analysis of the data using the Stored Program 16, and arrives at a value for the pitch of the input signal. The output of the pitch information is stored in the Output Latches 17 while a new sample of the waveform is being processed. The output may take any appropriate form such as: data to be sent to some other device via a communication link; an alphanumeric display of frequency, period, or pitch; a graphic display such as notes on a staff or keys on a keyboard; a thermometer-like linear display; or any other means of conveying pitch information to the end user. As indicated earlier, in the preferred embodiment the pitch information is reduced to seven values for the octave of the pitch, twelve values for the value of the note, and eight values for the error of the pitch as expressed in a number of cents (percent of the distance to the next semitone).

In the preferred embodiment the Decoder/Driver 18 converts the binary number stored in the Output Latches 17 into a signal that drives the Diaplay 18. Light Emitting Diode lamps are used as the display in the preferred embodiment but other choices of display devices are not excluded.

Figure 6:
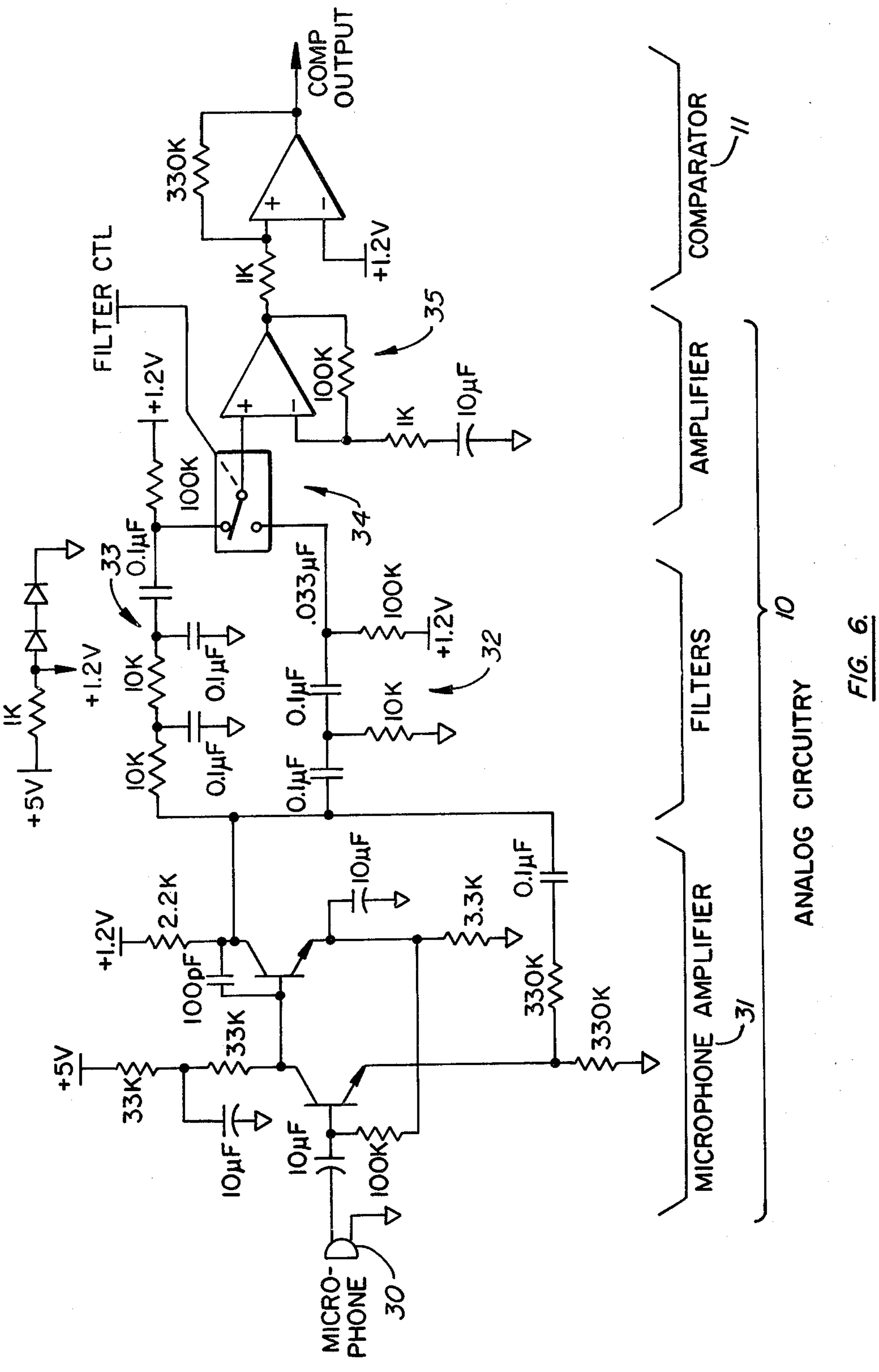
FIG. 6 is a complete schematic diagram of the analog portion of the circuitry.
Figure 7:
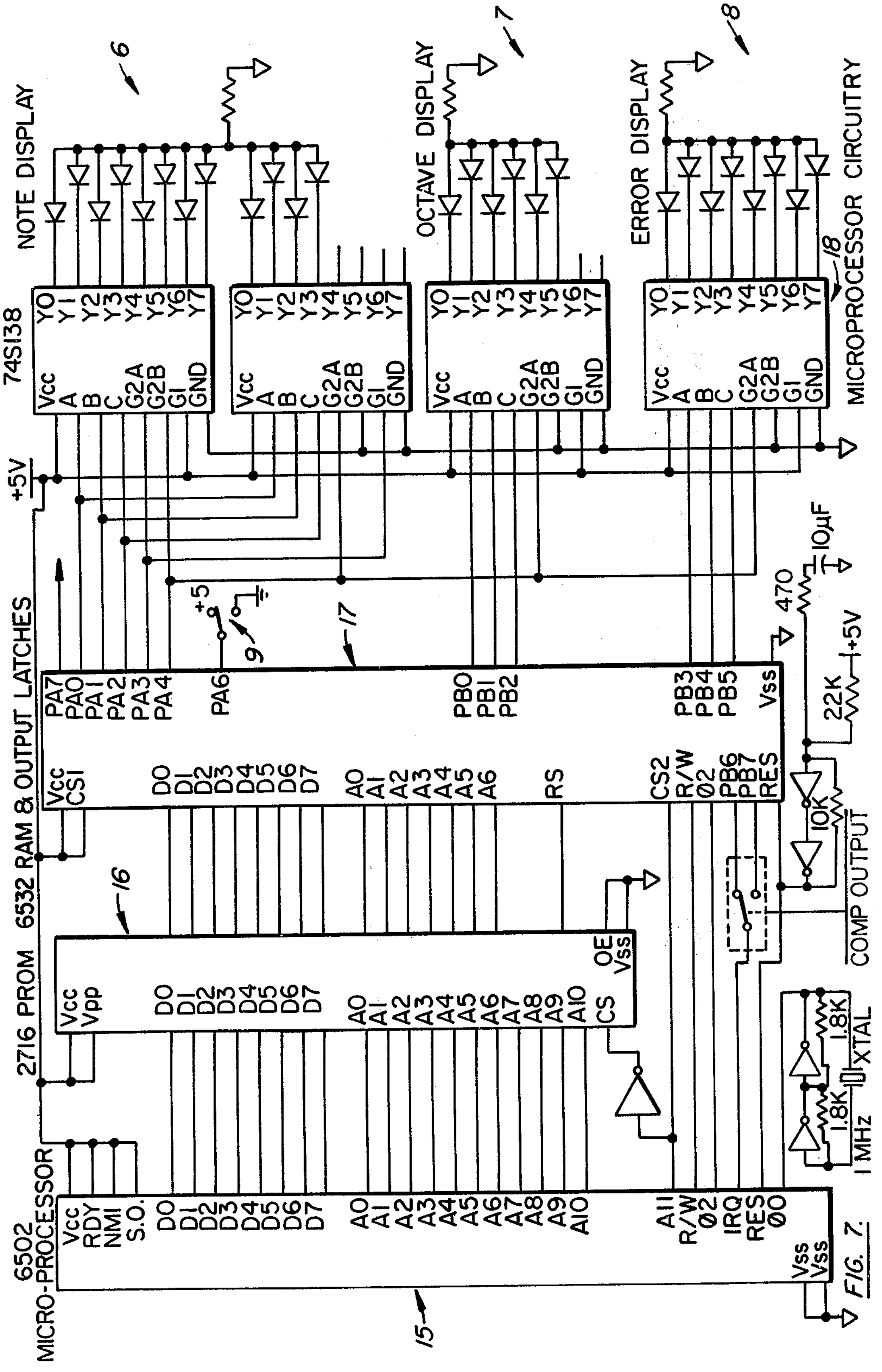
FIG. 7 is a complete schematic diagram of the digital portion of the prototype apparatus.

The invention as described by this block diagram does not imply the actual physical division of the components of the apparatus, but merely illustrates the functions which must be performed to achieve the objects of the invention. An example of one possible physical embodiment of the invention is shown in FIGS. 6 and 7, which uses a discrete transistor amplifier for the Preamp 10 and monolithic integrated circuit for the Comparator 11 and the Pulse Circuit 12. The Microprocessor 15 is a MOS silicon integrated circuit of the 6502 family. The stored program 16 appears on an Eraseable Read Only Memory of the type 2716. The Timer 13 is implemented as part of the Stored Program 16 which is executed by the Microprocessor 15. The Memory 14 and Output Latches 17 are on a single peripheral integrated circuit of the 6532 type, designed for use with the Microprocessor 15. The Decoder/Driver 18 is a TTL integrated circuit and drives the Display 19 which is an array of Light Emitting Diodes. An embodiment suited for high volume production could use one monolithic integrated circuit for the necessary analog functions and another for the digital functions.

SUMMARY OF THE CALCULATION TECHNIQUE

The fundamental concept employed by the Stored Program in this: if a segment of a periodic waveform containing several cycles is delayed by exactly one cycle time and compared with the original waveform, there will be a very good match or correlation between the original and delayed waveforms at all points along the segment. This is also true if the delay is an exact integer multiple of one cycle time. Any other delay times will show a weak correlation.

An additional key assumption which must be made is that the zero-crossings of naturally occurring acoustic waveforms contain sufficient information above the waveform that the true period of the waveform can be found by using the correlation technique described above on a two-state waveform having zero-crossings at the same points as the input waveform. This assumption has been found to be justified.

Figure 3:
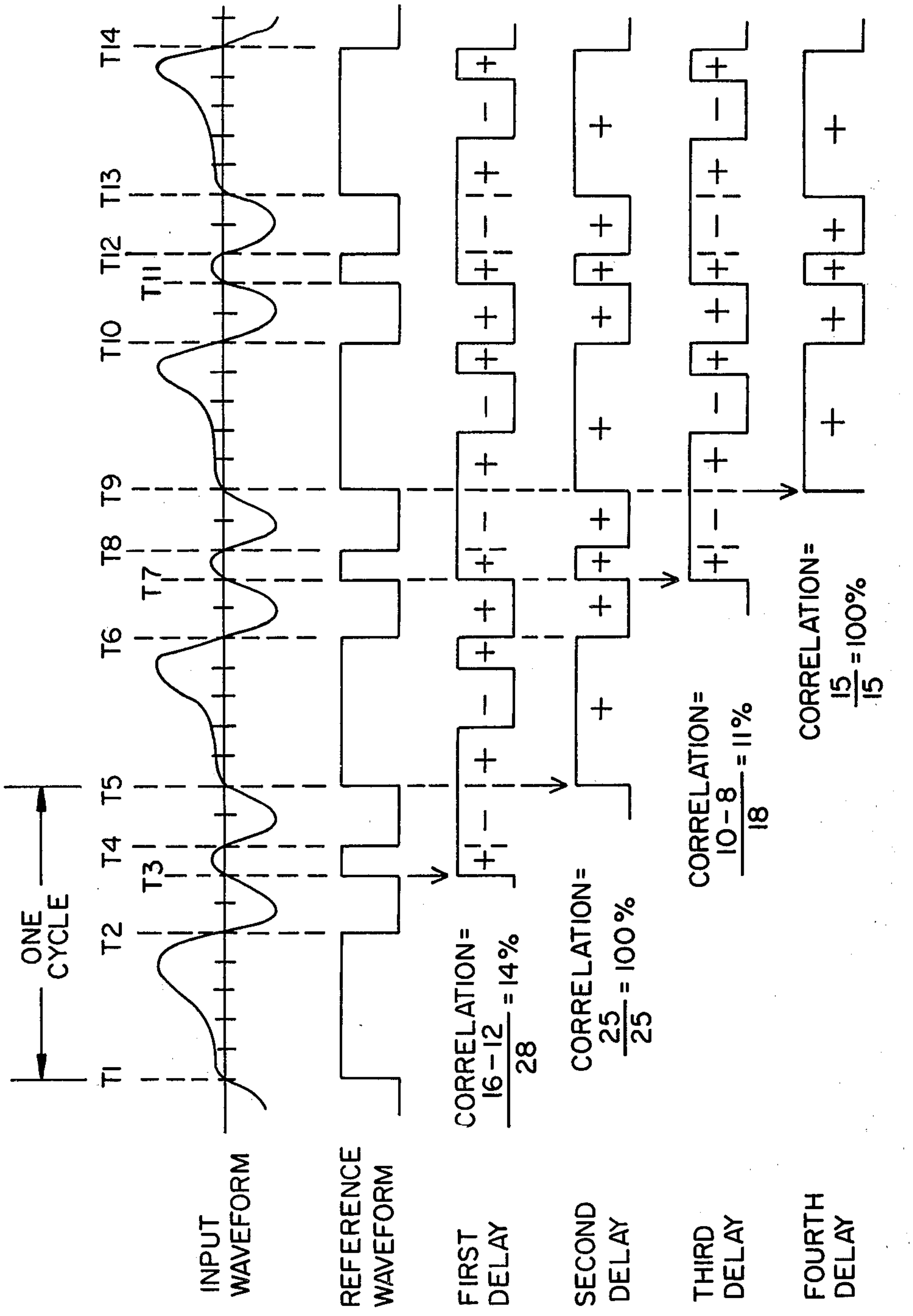
FIG. 3 illustrates the computation technique used to extract pitch information from the input waveform.

FIG. 3 is a pictorial representation of the technique used to calculate correlations and determine pitch. The Input Waveform is shown on a arbitrary time scale with each tic mark representing a unit of time. A zero-crossing of the Input Waveform is represented by a change in state of the Reference Waveform. The Reference Waveform is that which would appear at the output of the Comparator 11 shown in FIG. 2.

The true period of the Input Waveform is found by delaying the Reference waveform by various amounts and calculating the correlation corresponding to each delay. Those delays with the highest correlation are assumed to be times which are near integer multiples of one cycle period.

The first correlative calculation is performed by delaying the Reference Waveform so that the first positive going zero-crossing of the delayed waveform corresponds to the second positive-going zero-crossing of the Reference Waveform at T3. The correlation between this First Delay waveform and the original Reference Waveform is calculated by comparing the two waveforms at all points between the start of the First Delay waveform at T3 and the end of the Reference Waveform at T14. In this span of 28 time units, the waveforms have the same polarity for 16 units of time, as indicated by the plus signs in the First Delay waveform, and opposite polarity for 12 units of time, as indicated by the minus signs. The correlation is therefore given the value of (16–12)/28 which is 4/28 or 14%. This would be considered a poor correlation.

The next calculation is based on the Second Delay which results from delaying the Reference Waveform to the next positive-going zero-crossing so that it begins at T5. The Second Delay waveform and the Reference waveform have the same polarity for the entire 25 units of time from T5 to T14. This would yield a correlation of 25/25 or 100%, a perfect correlation. It should be noted that this delay time corresponds to exactly one cycle of the original waveform.

From T7 to T14 the Third Delay waveform has 10 units of time with the waveforms having the same polarity and 8 where they are opposite. This yields a correlation of (10–8)/18 which equals 2/18 or 11%, again a poor correlation.

The Fourth Delay waveform results from a delay equal to exactly two cycles and therefore has a perfect correlation over the time span T9 to T14.

Naturally occurring acoustic waveforms are not perfect and rarely have perfect correlations, yet there is usually a clear difference between the correlations that result from delays of a full cycle and delays that don't. To illustrate, let use assume there was an imperfection in the waveform such that it failed to go above zero from T7 to T8. When the correlation for the Second Delay was calculated there would be 24 units of time in which the waveforms were of the same polarity, and one where they were opposite. This would yield a correlation of (24–1)/25 which equals 92%, which is clearly much better than the correlations not corresponding to full cycle delays.

After this first family of correlations is calculated, the same Reference Waveform can be further analyzed by calculating a second family of correlations using T2 as the starting point rather than T1. A third family can then be started at T3 and so on until insufficient data remains to perform useful calculation.

As the correlation calculations are being performed, only those delays resulting in reasonably good correlations are retained in a list. This list can be ranked by correlation, and those delay times with the highest correlations retained. Alternatively, a list of valid delay times can be compiled by saving only those delay times corresponding to a correlation above a given threshold. To save the amount of memory allocated for the list, those delay times corresponding to one correlation threshold can be stored starting at one end of a list and those corresponding to a higher threshold entered at the opposite end of the list. When the list is filled, then those delays corresponding to the higher threshold are allowed to overwrite those corresponding to the lower threshold, resulting in a continual improvement in the quality of data in the list.

When the list is complete, the smallest delay time with a good correlation is then compared with all the others. If this smallest time is very much less than the largest, it can be assumed that it was not the result of a delay of a full cycle, but only a very small fraction of a cycle. Such a delay is declared invalid and the remainder of the data is examined to find a delay which is believed to correspond to a full cycle of the waveform. Those delay times that are close to integer multiples of the smallest valide time are normalized by dividing the time by the exact integer value. Those times that are not near integer multiples are discarded. The pitch of the note is then calculated by taking the average of all these normalized times.

To make the pitch analyzer more useful as a tool when used with the human voice or other complex sounds, additional calculations can be performed on the pitch data. The display of pitch can be inhibited until at least two consecutive similar pitch values have been obtained and their average taken. Subsequent similar pitch data can then be averaged so that the displayed pitch equals the present pitch value plus the difference between the newly acquired pitch and the present pitch divided by some number, N. The larger the value of N the less the new pitch will affect the displayed pitch. In the preferred embodiment N=4. The advantages gained by using this averaging technique are several. First, meaningless pitch readings due to transient onset phenomena in acoustic sounds are suppressed. Second, acoustic waveforms with superimposed noise or naturally imprecise pitch definition are displayed more stably. Finally, the wide pitch swings of a sound with a substantial vibrator are averaged to yield a more easily interpreted display.

To accommodate various pitch and tuning standards the clock frequency used to measure the time of the zero-crossings can be varied without requiring any change in the constants used by the program. Conversely a vareity of reference pitches or tuning systems can be selected by changing the constants used in the computing program.

DETAILED COMPUTER PROGRAM OUTLINE

The program has four major sections which perform four distinct tasks. The first section records the time of occurrence of zero-crossings of the input waveform. The second compiles a list of time delays for which high correlations have been calculated. The third operates upon these delay times to calculate a pitch. The fourth, which is optional, performs an averaging of successive calculated pitch values. The following is a detailed description of each of these functions. The complete program listing written in 6502 assembly language can be found in Appendix I.

A. RECORD THE TIME OF ZERO-CROSSING TRANSITIONS OF THE INPUT WAVEFORM

1. Create a counter in either hardware or software with a clock frequency such that the counter will not overflow for the largest time interval expected.

2. Using the above counter, record the time of each zero-crossing transition of the waveform in a Transition Time Table which resides in the Memory 14 which is accessible by the Microprocessor performing the correlation analysis.

3. When the desired number of zero-crossings transition times have been recorded in the Transition Time Table or a predetermined time limit has been reached, stop recording transition times.

4. To reduce round-off errors in the succeeding correlation calculations, every entry in the Transition Time Table can be repeatedly shifted left (multiplied by two)

until the largest number overflows, recording the number of shifts in a variable named Octave.

B. COMPILE A LIST OF DELAY TIMES CORRESPONDING TO GOOD CORRELATIONS

1. Set a pointer called the Reference pointer to the first entry in the Transition Time Table and a pointer called the Delay pointer to the third entry, corresponding to the frst and second zero-crossings of the same polarity.

2. Calculate the correlation between the two waveforms which are represented by the data in the Transition Time Table, starting at the time value of the Delay pointer.

a. Set a variable called Delay equal to the difference between the times pointed to by the two pointers.

b. Find whether the time difference between the present zero-crossing and the next zero-crossing is less for the data pointed to by the Reference pointer or the Delay Pointer. (Subtract Delay for all times relating to the Delay pointer so that times from the Transition Time Table can be easily compared.)

c. Add the time difference to this nearest zero-crossing to the variable called Correlation Total since it is known that the two waveforms start with the same polarity.

d. Advance in time until the next nearest transition is found in either waveform and subtract the time difference between this transition and the previous one from the Correlation Total, since the waveforms must now be of opposite polarity.

e. Continue advancing in time, subtracting each time difference between transition from the Correlation Total if one pointer is at an odd numbered position in the Transition Time Table and the other is at an even numbered position in the table. Add the time difference to the Correlation Total if both pointers are at odd numbered positions or both are at even numbered positions.

f. When the end of the Transition Time Table is reached calculate the correlation of the two waveforms by dividing the Correlation Total by the total time from the Delay pointer starting time to the end of the Transition Time Table.

3. If the correlation is above a given threshold save the Delay time in the Delay Time List, if not, then discard.

4. Set the Reference and Delay pointers to the first and fifth entries in the Transition Time Table and perform steps 2 and 3.

5. Continue setting the Delay pointer on successive odd numbered entries in the Transition Time Table and performing steps 2 and 3 until either a given number of entries have been entered in the Delay Time List or there is not more valid data in the Transition Time Table.

6. Set the Reference pointer to the second entry and Delay pointer to the fourth entry in the Transition Time Table and perform operations similar to those in steps 2 through 5, except that only even numbered transitions are used.

7. Perform several groups of calculations similar to steps 2 through 6, advancing the Reference pointer to successive entries in the Transition Time Table until either a sufficient number of entries have been accumulated in the Delay Time List or there is no more valid data in the Transition Time Table.

C. DETERMINE THE PITCH FROM THE CORRELATION DATA

1. Find the longest and shortest Delay in the Delay Time List.

2. If the ratio of these numbers is not too large (less than 8 in the preferred embodiment) assume that the smaller one represents one cycle of the waveform.

3. If the above ratio is too large assume that the small Delay is not valid and discard this entry from the Delay Time List.

4. Repeat steps 2 and 3 until a valid smallest Delay is found.

5. Examine each Delay Time and mark as invalid those that are not close to integer multiples of the shortest valid Delay Time found in the previous step.

6. If there is an insufficient number of entries remaining in the Delay Time Lst then assume that there was no valid pitch present in the present sound sample, terminate this pitch calculation attempt, and start from the beginning at step A.

7. If there is a sufficient number of entries in the Delay Time List then divide each valid Delay Time by the nearest exact integer to normalize all of the Delay Times to represent one cycle time of the waveform.

8. Calculate the pitch of the note by taking the average of all the valid normalized Delay Times.

D. PERFORM AVERAGING OF SUCCESSIVE PITCH VALUES (OPTIONAL)

1. If the new pitch value is not close to the last value then turn off the display and get new zero-crossing data.

2. If the new pitch value is close to the previous pitch value then average it with the previous value and display this calculated Pitch value.

3. If the new pitch value is the third or greater consecutive close pitch value then calculate the new averaged pitch value by the formula:

AVERAGE PITCH=LAST PITCH+(NEW PITCH−LAST PITCH)/N where N may be fixed or adjusted dynamically based on the number of consecutive close pitch values that have occurred.

In summary, it can be seen that the present invention provides a Pitch Analyzer which extracts the relevant features from the input waveform and displays these features in a manner meaningful to musicians. While the above provides a full and complete disclosure of the preferred embodiment of the present invention, it will be immediately recognized that various modifications, alternate constructions, and equivalents may be employed without departing from the true spirit and scope of the invention. For example, while an instrument directed to musicians has been disclosed, the basic instrument can also be used for speech therapy and the like. Therefore, the above description and illustrations should not be construed as limiting the scope of the invention which is defined by the appended claims.

```
                .OFFSET $8000
                ;
                ;                    PROTOTYPE
                ;                     9/29/81
                ;
                ;**********************************************************
                ;                IRQ AND RESET VECTORS
                ;
                * = $FFA
FFA             ;
FFA 4008        .WORD INIT           NMI
FFC 4008        .WORD INIT           RESET
FFE 0008        .WORD INTRPT         IRQ
1000            ;
1000            * = $800
800             ;**********************************************************
800             ;                      I/O
800             ;
800             IO = $200
800             PORTA  =IO
800             ;BITS 0-3  NOTE DSPL
800             ;BIT 4     HI => DSPL ENABLE
800             ;BIT 5     N/A
800             ;BIT 6     DIG AVG SW INPUT
800             ;BIT 7     FILTER CTL
800             DDRA   =IO+1
800
800             PORTB  =IO+2
800             ;BITS 0-2  ERROR DSPL
800             ;BITS 3-5  OCTAVE DSPL
800             ;BITS 6-7  IRQ POL CTL
800             DDRB   =IO+3
800             ;
800             ;**********************************************************
800             ;                   VARIABLES
800             ;
800             Z      =0
800             ;
800             ;               CNTR AND IRQ
800             ;
800             YTEMP  =Z
800             YVAL   =Z+1            ADJUSTED Y VALUE
800             TBLPT  =Z+2
800             ERRL   =Z+3         ; CORRECTION NEEDED FOR TIME
800             ERRH   =Z+4         ; LOST IN INTERRUPT ROUTINE
800             ;
800             ;                CORRELATION
800             ;
800             CORLO  =Z+5
800             CORHI  =Z+6
800             OFFSTL =Z+7            TIME OFFSET OF DELAY
800             OFFSTH =Z+8
800             SIGLO  =Z+9            TOTAL OF TIME SIGNAL WAS NON-ZERO
800             SIGHI  =Z+$A
800             TIMELO =Z+$B           TIME OF A TRANSITION
800             TIMEHI =Z+$C
```

```
800   LASTLO =Z+$D          TIME OF LAST TRANSITION
800   LASTHI =Z+$E
800   LASTDL =Z+$F          LAST VALUE OF THE DELAY POINTER
800   DELAYN =Z+$10         # OF DELAY TIME
800   BEGINN =Z+$11         # OF BEGIN TIME
800   CORVAL =Z+$12         VALUE OF CORRELATION: -1,0,OR +1
800   LASTX  =Z+$13
800   REFX   =Z+$14         TEMP FOR X REG
800   BGNTBL =Z+$15         BEGINNING PT IN TBL FOR CORLAT
800   CORCNT =Z+$16         # OF COR >.75 ALLOWED IN TABLE
800   ;
800   MAXLO  =Z+$17         MAX VAL OF TIME OFFSET
800   MAXHI  =Z+$18
800   MINLO  =Z+$19         MIN VAL OF TIME OFFSET
800   MINHI  =Z+$1A
800   OVERFL =Z+$1B
800   ;
800   BINLO  =Z+$1C
800   BINHI  =Z+$1D
800   TOTALL =Z+$1E         TOTAL OF OFFSETS
800   TOTALH =Z+$1F
800   NTOTAL =Z+$20         # OF ENTRIES
800   ;
800   ;          PANEL INTERFACE
800   ;
800   NEWNOT =Z+$21
800   NEWERR =Z+$22
800   NEWOCT =Z+$23
800   ;
800   ;          GLOBAL VARIABLES
800   ;
800   NNEW   =Z+$24
800   LSTOCT =Z+$25
800   GCOUNT =Z+$26         # OF CONSECUTIVE GOOD CORSUMS
800   PCOUNT =Z+$27         ................. POOR .......
800   AVGLO  =Z+$28         AVG VALUE OF PERIOD
800   AVGHI  =Z+$29
800   ;
800   ;***********************************************************
800   ;              TABLES
800   ;
800   TIMTBL =$2F   ZERO-CROSSING TIMES
800   TIMTBH =$43
800   ;
800   PERTBL =$57   TIMES POTENTIALLY CORRESPONDING
800   PERTBH =$67   TO WAVEFORM PERIOD
800   ;
800   RATIOT =$2F
800   ;
800   ;***********************************************************
800   ;                CONSTANTS
800   ;
800   INCCOR =20            # OF CYCLES/S LOST IN IRQ ROUTINE
800   TBLLEN =20            TIME TBL LEN
800   NDELAY =6             # OF DELAY VALS USED
800   NBEGIN =4             # OF BEGIN VALS USED
800   MAXCOR =4             MAX # IN PERTB FOR ONE BEGIN
```

```
800        ENDMRK =$FF                     MARK TIME TBL END
800        MINLIM =25159                   SMALLEST ALLOWED PERIOD: B/C
800               ;
800               ;*****************************************************
800               ;      UPON INTERRUPT RECORD TIME IN TIMTBL
800               ;*****************************************************
800               ;
800               ;     ADJUST HI BYTE IF LO BYTE HAS JUST ROLLED OVER
800               ;
800               ;                                OF MACHINE CYCLES
800               ;
800 68     INTRPT PLA                      CHECK THE Z FLAG ON THE STACK
801 48            PHA
802 2902          AND #2
804 D008          BNE INTRP1               Z FLAG WAS SET
806               ;
806 AD0202        LDA PORTB                SAVE STATE OF PORT B IN ACC.
809 8400          STY YTEMP
80B 4C1408        JMP INTRP2
80E               ;
80E AD0202 INTRP1 LDA PORTB
811 8400          STY YTEMP
813 C8            INY                      X HAS ROLLED OVER IN SOFTWARE
814               ;                        COUNTER AND Y MUST BE UPDATED
814               ;
814               ;       GET INPUT STATE & TURN OFF HARDWARE INTERRUPT
814               ;
814 8401   INTRP2 STY YVAL                 SAVE ADJUSTED TIME VALUE HI BYTE
816 49C0          EOR #$C0                 FLIP BITS TO TURN OFF IRQ
818 8D0202        STA PORTB
81B A402          LDY TBLPT
81D EA            NOP
81E               ;
81E               ;       ADD COUNTS WHICH ARE LOST WHEN THE COUNTER STOPS
81E               ;       WHILE THIS INTERRUPT ROUTINE BEING SERVICED
81E               ;
81E 8A            TXA                      LO BYTE OF TIME
81F 18            CLC
820 6503          ADC ERRL
822 992F00        STA TIMTBL,Y
825 A501          LDA YVAL                 HI BYTE OF TIME
827 6504          ADC ERRH
829 994300        STA TIMTBH,Y
82C 3013          BMI INTRPX               EXIT IF OVERFLOW
82E               ;
82E               ;       UPDATE THE TOTAL NUMBER OF COUNTS LOST
82E               ;
82E A914          LDA #INCCOR
830 6503          ADC ERRL
832 8503          STA ERRL
834 A900          LDA #0                   = LDA #0 WITH ONE EXTRA CYCLE
836 6504          ADC ERRH
838 8504          STA ERRH
83A               ;
83A C602          DEC TBLPT
83C F009          BEQ INTRX1
83E A400          LDY YTEMP
```

```
840 40                RTI
841              ;
841              ;         TIME OVERLOW -  MARK TABLE END, ADJUST STACK,
841              ;         AND JUMP TO CORRELATION CALC EXECUTIVE
841              ;
841 78           INTRPX SEI
842 A9FF                LDA #ENDMRK
844 994300              STA TIMTBH,Y
847 68           INTRX1 PLA
848 68                  PLA
849 68                  PLA
84A 4CC908              JMP CORECX
84D              ;
84D              ;**************************************************************
84D              ;            INIT HARDWARE AND SETUP FOR 16 BIT SOFTWARE
84D              ;            COUNTER WITH X AS LO AND Y AS HI BYTE
84D              ;**************************************************************
84D              ;
84D 78           INIT   SEI
84E D8                  CLD
84F A27F                LDX #$7F
851 9A                  TXS
852 A2FF                LDX #$FF
854 8E0302              STX DDRB          PORT B = OUTPUT
857 A9BF                LDA #$BF
859 8D0102              STA DDRA          PORT A = OUTPUT EXCEPT B6
85C              ;
85C              ;      PERFORM DISPLAY TEST
85C              ;
85C A000                LDY #0
85E A930                LDA #$30
860 8506                STA CORHI         OCTAVE DISPLAY
862 D019                BNE INIT4
864              ;
864 8E0002       INIT1  STX PORTA
867 A505         INIT2  LDA CORLO         ERROR DISPLAY
869 0506                ORA CORHI
86B 8D0202              STA PORTB
86E              ;
86E 88           INIT3  DEY               TIME DELAY
86F D0FD                BNE INIT3
871 C607                DEC OFFSTL
873 D0F9                BNE INIT3
875              ;
875 A919                LDA #25           TIME
877 8507                STA OFFSTL
879 C605                DEC CORLO
87B 10EA                BPL INIT2
87D A907         INIT4  LDA #7
87F 8505                STA CORLO
881 A506                LDA CORHI
883 38                  SEC
884 E908                SBC #8
886 1002                BPL INIT5
888 A928                LDA #$28
88A 8506         INIT5  STA CORHI
88C E8                  INX
```

```
88D E00C            CPX #$0C
88F D003            BNE INITX
891                 ;
891 A9FF     INITX  LDA #$FF          TURN OFF DISPLAY
893 8D0002          STA PORTA
896                 ;
896 78       START  SEI
897 D8              CLD
898 A27F            LDX #$7F
89A 9A              TXS
89B A223            LDX #$23
89D A900            LDA #0
89F 9500     START1 STA Z,X           ZERO VARIABLES
8A1 CA              DEX
8A2 10FB            BPL START1
8A4                 ;
8A4 AD0202          LDA PORTB         SET PORT B IRQ CONTROL
8A7 0980            ORA #$80          BIT 7 HI
8A9 29BF            AND #$BF          BIT 6 LO
8AB 8D0202          STA PORTB
8AE A914            LDA #TBLLEN
8B0 8502            STA TBLPT         PTR TO TABLE OF TIME ENTRIES
8B2 A000            LDY #0
8B4 A200            LDX #0
8B6 58              CLI
8B7                 ;
8B7                 ;     COUNTER LOOP WITH CLOCK = SYSTEM CLOCK / 5
8B7                 ;
8B7 E8       COUNT  INX               INNER LOOP FOR LO BYTE
8B8 D0FD            BNE COUNT
8BA C8              INY               UPDATE HI BYTE
8BB 3004            BMI COUNTX        TIME IS OVER
8BD E8       COUNT1 INX               ALLOW X REG TO "CATCH UP"
8BE E8              INX               ... AND REJOIN INNER LOOP
8BF D0F6            BNE COUNT
8C1                 ;
8C1                 ;     MARK TABLE END AND FALL THRU TO CORRELTION EXEC
8C1                 ;
8C1 78       COUNTX SEI
8C2 A402            LDY TBLPT
8C4 A9FF            LDA #ENDMRK
8C6 994300          STA TIMTOH,Y
8C9                 ;
8C9                 ;**************************************************************
8C9                 ;     FIND THE CORRELATION BETWEEN THE 2-STATE WAVEFORM
8C9                 ;     AND THE SAME WAVEFORM DELAYED, USING UP TO 5 DELAY
8C9                 ;     TIMES AND 4 BEGINNING POINTS WITH THE TOTAL LIMITED
8C9                 ;     TO 16 CALCULATED CORRELATION VALUES
8C9                 ;**************************************************************
8C9                 ;
8C9                 ;     LEFT JUSTIFY THE DATA IN THE TIME TABLE
8C9                 ;
8C9 8402     COREXC STY TBLPT
8CB C00E            CPY #TBLLEN-6
8CD 301D            BMI CORXA         TABLE LENGTH > 6, USE THE DATA
8CF A9FF     OFFDSP LDA #$FF          BAD DATA, INIT GOOD COUNT
8D1 8526            STA GCOUNT
```

```
8D3 AD0002          LDA PORTA       FLIP FILTER
8D6 4980            EOR #$80
8D8 8D0002          STA PORTA
8DB C627            DEC PCOUNT      ELSE, TURN OFF DISPLAY AFTER 3
8DD 10B7            BPL START          BAD TABLES
8DF E627            INC PCOUNT
8E1 AD0002          LDA PORTA
8E4 0910            ORA #$10        TURN OFF DISPLAY
8E6 8D0002          STA PORTA
8E9 4C9608          JMP START
8EC          ;
8EC E626     CORXA  INC GCOUNT      GOOD DATA
8EE B94300          LDA TIMTBH,Y
8F1 C9FF            CMP #ENDMRK
8F3 D002            BNE CORX1
8F5 E602            INC TBLPT
8F7 A602     CORX1  LDX TBLPT
8F9 B52F            LDA TIMTBL,X
8FB 1543            ORA TIMTBH,X
8FD F000            BEQ OFFDSP      AVOID INFINITE LOOP ON ZERO DATA
8FF 162F            ASL TIMTBL,X
901 3643            ROL TIMTBH,X
903 300D            BMI CORX3       BRANCH IF NUMBER IS TOO BIG
905 E623            INC NEWOCT      RECORD THE SHIFT AS OCTAVE CHANGE
907 E8       CORX2  INX
908 162F            ASL TIMTBL,X
90A 3643            ROL TIMTBH,X
90C E014            CPX #TBLLEN
90E D0F7            BNE CORX2
910 F0E5            BEQ CORX1
912          ;
912 5643     CORX3  LSR TIMTBH,X    ADJUST NUMBER BACK
914 762F            ROR TIMTBL,X
916          ;
916          ;      ZERO PERIOD TABLE
916          ;
916 A210            LDX #16
918 A900            LDA #0
91A 9567     ZPERTB STA PERTBH,X
91C 9557            STA PERTBL,X
91E CA              DEX
91F D0F9            BNE ZPERTB
921          ;
921          ;      SET 1ST BEGIN POINT AT 4TH TRANSITION IN TBL
921          ;
921 A910            LDA #TBLLEN-NBEGIN
923 8515            STA BGNTBL
925          ;
925          ;      INITE BEGIN AND DELAY PTRS
925          ;
925 A906            LDA #NDELAY
927 8510            STA DELAYN
929 A904            LDA #NBEGIN
92B 8511            STA BEGINN
92D A901            LDA #1
92F 8502            STA TBLPT
931          ;
```

```
931             ;       INIT LAST DELAY PTR AND ALLOW NO MORE THAN MACOR
931             ;       GOOD PERIODS IN TBL
931             ;
931 A515        COREX3  LDA BGNTBL
933 850F                STA LASTDL
935 A904                LDA #MAXCOR
937 8516                STA CORCNT
939             ;
939             ;       INIT FOR ONE CORRELATION CALCULATION:
939             ;         X REG POINTS TO REF TRANSITIONS IN WAVEFORM TABLE
939             ;         Y REG WILL POINT TO SIMILAR TRANSITIONS, DELAYED
939             ;
939 A615        CORLAT  LDX BGNTBL
93B A900                LDA #0
93D 8505                STA CORLO
93F 8506                STA CORHI
941 A40F                LDY LASTDL         DELAY USED FOR LAST CORRELATION
943             ;
943             ;       GET NEXT VALUE OF DELAY BY DECREMENTING THE
943             ;       DELAY PTR (Y) TWICE
943             ;
943 88                  DEY
944 F007                BEQ CORLAX         END OF LONG TBL
946 B94300              LDA TIMTBH,Y
949 C9FF                CMP #ENDMRK
94B D003                BNE CORLA3         NOT END OF SHORT TBL
94D             ;
94D 4C440A      CORLAX  JMP COREND         NOTHING LEFT TO CORRELATE
950             ;                          USING THIS BEGIN VALUE
950             ;
950 88          CORLA3  DEY
951 F0FA                BEQ CORLAX
953 B94300              LDA TIMTBH,Y
956 C9FF                CMP #ENDMRK
958 F0F3                BEQ CORLAX
95A             ;
95A 840F                STY LASTDL          SAVE THE VALUE OF DELAY POINTER
95C             ;
95C             ;       CALC TIME OFFSET OF DELAY AND SAVE
95C             ;       TIME VALUE AT DELAY POINTER
95C             ;
95C 38                  SEC
95D B92F00              LDA TIMTBL,Y
960 8509                STA SIGLO
962 F52F                SBC TIMTBL,X
964 8507                STA OFFSTL
966 B94300              LDA TIMTBH,Y
969 850A                STA SIGHI
96B F543                SBC TIMTBH,X
96D 8508                STA OFFSTH
96F             ;
96F             ;       SET STARTING TIME OF COR CALC
96F             ;
96F B52F                LDA TIMTBL,X
971 850D                STA LASTLO
973 B543                LDA TIMTBH,X
975 850E                STA LASTHI
```

```
977              ;
977              ;********************  CALCULATE TOTAL CORRELATION USING
977              ;                      EACH TRANSITION IN THE TIME TABLE
977              ;
977              ;       CALCULATE THE DEGREE OF CORRLEATION BETWEEN THE
977              ;       INPUT AT THIS TIME AND THE DELAYED TIME:
977              ;       CORRELATION VALUE = STATE(TIME) * STATE(DELAY)
977              ;
977 8400         CORCAL STY YTEMP
979 8A                  TXA
97A 4500                EOR YTEMP
97C 2901                AND #1
97E 8512                STA CORVAL        0 => POS CORRELATION; 1 => NEG
980              ;
980              ;       ADVANCE BOTH PTRS TO NEXT TRANSITION
980              ;
980 CA                  DEX
981 F00A                BEQ CORCLX
983 88                  DEY
984 F007                BEQ CORCLX        END OF LONG TABLE
986 B94300              LDA TIMTBH,Y
989 C9FF                CMP #ENDMRK
98B D013                BNE CORCL3        NOT END OF SHORT TABLE
98D              ;
98D              ;       END OF TIME TABLE, CALC TOTAL TIME AND PUT IN SIG
98D              ;
98D C8           CORCLX INY
98E 38                  SEC
98F B92F00              LDA TIMTBL,Y
992 E509                SBC SIGLO
994 8509                STA SIGLO
996 B94300              LDA TIMTBH,Y
999 E50A                SBC SIGHI
99B 850A                STA SIGHI
99D 4C000A              JMP CORTOT
9A0              ;
9A0              ;       "TIME" = TIME(DELAYED) - OFFSET
9A0              ;
9A0 38           CORCL3 SEC
9A1 B92F00              LDA TIMTBL,Y
9A4 E507                SBC OFFSTL
9A6 850B                STA TIMELO
9A8 B94300              LDA TIMTBH,Y
9AB E508                SBC OFFSTH
9AD 850C                STA TIMEHI
9AF              ;
9AF              ;       COMPARE TIME(REF) WITH "TIME"
9AF              ;
9AF 38                  SEC
9B0 A50B                LDA TIMELO
9B2 F52F                SBC TIMTBL,X
9B4 A50C                LDA TIMEHI
9B6 F543                SBC TIMTBH,X
9B8 900C                BCC CORCL4
9BA              ;
9BA              ;       IF T(REF) =< "TIME" THEN LET "TIME" = T(REF)
9BA              ;
```

```
9BA C8            INY                  RESTORE DELAY POINTER
9BB B52F          LDA TIMTBL,X
9BD 850B          STA TIMELO
9BF B543          LDA TIMTBH,X
9C1 850C          STA TIMEHI
9C3 4CC709        JMP CORCL5
9C6         ;
9C6         ;     IF T(REF) > "TIME" THEN LEAVE "TIME" AS IS
9C6         ;
9C6 E8      CORCL4 INX                 RESTORE REF POINTER
9C7         ;
9C7         ;     CALC TIME INTERVAL BETWEEN THIS TRANSITION
9C7         ;     LAST AND TEMPORARILY SAVE RESULT IN "LAST"
9C7         ;
9C7 38      CORCL5 SEC
9C8 A50B          LDA TIMELO
9CA E50D          SBC LASTLO
9CC 850D          STA LASTLO
9CE A50C          LDA TIMEHI
9D0 E50E          SBC LASTHI
9D2 850E          STA LASTHI
9D4         ;
9D4         ;     USE CORRELATION VALUE TO DETERMINE WHETHER TO ADD,
9D4         ;     SUBTRACT, OR DO NOTHING WITH THIS TIME INTERVAL
9D4         ;
9D4 A512          LDA CORVAL
9D6 D010          BNE CORCL6           SUBTRACT
9D8         ;
9D8 18            CLC                  ADD
9D9 A505          LDA CORLO
9DB 650D          ADC LASTLO
9DD 8505          STA CORLO
9DF A506          LDA CORHI
9E1 650E          ADC LASTHI
9E3 8506          STA CORHI
9E5 4CF509        JMP CORCL7
9E8         ;
9E8 38      CORCL6 SEC
9E9 A505          LDA CORLO
9EB E50D          SBC LASTLO
9ED 8505          STA CORLO
9EF A506          LDA CORHI
9F1 E50E          SBC LASTHI
9F3 8506          STA CORHI
9F5         ;
9F5         ;     SAVE TIME OF THIS TRANSITION IN "LAST"
9F5         ;
9F5 A50B    CORCL7 LDA TIMELO
9F7 850D          STA LASTLO
9F9 A50C          LDA TIMEHI
9FB 850E          STA LASTHI
9FD         ;
9FD 4C7709        JMP CORCAL           GO TO NEXT TRANSITION
A00         ;
A00         ;****************** PUT VALID PERIODS IN TABLE
A00         ;
A00 A506    CORTOT LDA CORHI
```

```
A02 303C          BMI CORT02      IGNORE NEGATIVE CORRELATIONS
A04             ;
A04             ;       MULTIPLY SIG BY 3/4
A04             ;
A04 460A          LSR SIGHI
A06 A60A          LDX SIGHI
A08 6609          ROR SIGLO
A0A A409          LDY SIGLO
A0C 460A          LSR SIGHI
A0E 6609          ROR SIGLO
A10 18            CLC
A11 98            TYA
A12 6509          ADC SIGLO
A14 8509          STA SIGLO
A16 8A            TXA
A17 650A          ADC SIGHI
A19 850A          STA SIGHI
A1B             ;
A1B             ;       COMPARE COR TO 3/4 SIG
A1B             ;
A1B C506          CMP CORHI
A1D 9008          BCC CORT01      GOOD COR - PUT IN TBL
A1F D01F          BNE CORT02      BAD COR - TRY NEXT DELAY
A21 A509          LDA SIGLO       HI BYTES EQUAL, TRY LO
A23 C505          CMP CORLO
A25 B019          BCS CORT02      BAD COR - TRY NEXT DELAY
A27             ;
A27             ;       PUT OFFSET IN PERIOD TABLE
A27             ;
A27 A602        CORT01 LDX TBLPT
A29 8613          STX LASTX
A2B 8603          STX ERRL
A2D A507          LDA OFFSTL
A2F 9557          STA PERTBL,X
A31 A508          LDA OFFSTH
A33 9567          STA PERTBH,X
A35 E8            INX
A36 8602          STX TBLPT
A38 E011          CPX #17
A3A 1021          BPL LOWEST      AVOID TBL OVERFLOW
A3C C616          DEC CORCNT
A3E F004          BEQ COREND      IF # OF COR >.75 = MAXCOR
A40             ;
A40 C610        CORT02 DEC DELAYN
A42 D00D          BNE CORT04      GO ON TO NEXT DELAY VALUE
A44             ;
A44 A906        COREND LDA #NDELAY    RESTORE NDELAY VALUE
A46 8510          STA DELAYN
A48 E615          INC BGNTBL      GET NEXT BEGIN VALUE
A4A             ;
A4A C611          DEC BEGINN      POINT TO NEXT TABLE
A4C F006          BEQ VALID       DONE, SEE IF VALID RESULTS
A4E 4C3109        JMP COREX3      DO NEXT TABLE
A51             ;
A51 4C3909      CORT04 JMP CORLAT     DO ANOTHER CORRELATION CALC
A54             ;
A54             ;       IF LESS THAN 4 ENTRIES IN PERIOD TBL REJECT DATA
```

```
A54
A54 A502    VALID  LDA TBLPT
A56 C904           CMP #4
A58 B003           BCS LOWEST
A5A 4CCF08         JMP OFFDSP
A5D                ;
A5D                ;*****************************************************************
A5D                ;  SERACH FOR THE LOWEST AND HIGHEST TIME OFFSET VALUE
A5D                ;  AMONG THOSE WITH CALCORS GREATER THAN .75, AND REJECT
A5D                ;  THE LOWEST IF IT IS LESS THAN 1/8 THE HIGHEST
A5D                ;*****************************************************************
A5D                ;
A5D A902    LOWEST LDA #2           INIT POOR COUNT
A5F 8527           STA PCOUNT
A61 A513           LDA LASTX
A63 8502           STA TBLPT        COUNT NUMBER OF BAD RATIOS
A65 A9FF    LOWST  LDA #$FF
A67 8519           STA MINLO
A69 851A           STA MINHI
A6B A900           LDA #0
A6D 8517           STA MAXLO
A6F 8518           STA MAXHI
A71 A613           LDX LASTX
A73                ;
A73                ;       FIND THE LOWEST VALUE AND PUT IN MIN
A73                ;
A73 B567    LOWST0 LDA PERTBH,X
A75 3032           BMI LOWST4      MARKED INVALID
A77 C51A           CMP MINHI
A79 900D           BCC LOWST1       IF MINHI IS LARGER THAN TBL VALUE
A7B D013           BNE LOWST2       IF MINHI IS LESS
A7D B557           LDA PERTBL,X     HI BYTES ARE EQUAL, CHECK LO
A7F C519           CMP MINLO
A81 B00D           BCS LOWST2       IF MINLO IS = OR SMALLER
A83 8519           STA MINLO
A85 4C900A         JMP LOWST2
A88 851A    LOWST1 STA MINHI
A8A B557           LDA PERTBL,X
A8C 8519           STA MINLO
A8E 8614           STX REFX         SAVE POINTER TO THIS MIN VALUE
A90                ;
A90                ;       FIND THE HIGHEST VALUE AND PUT IN MAX
A90                ;
A90 B567    LOWST2 LDA PERTBH,X
A92 C518           CMP MAXHI
A94 9013           BCC LOWST4       IF MAXHI IS LARGER THAN TBL VALUE
A96 D00B           BNE LOWST3       IF MAXHI IS LESS
A98 B557           LDA PERTBL,X     HI BYTES ARE EQUAL, CHECK LO
A9A C517           CMP MAXLO
A9C 900B           BCC LOWST4       IF MAXLO IS LARGER
A9E 8517           STA MAXLO
AA0 4CA90A         JMP LOWST4
AA3 8518    LOWST3 STA MAXHI
AA5 B557           LDA PERTBL,X
AA7 8517           STA MAXLO
AA9                ;
AA9 CA      LOWST4 DEX
```

```
AAA D0C7                BNE LOWST0
AAC             ;
AAC             ;       CHECK IF MAX / 8 IS GREATER THAN MIN
AAC             ;
AAC 4618                LSR MAXHI
AAE 6617                ROR MAXLO
AB0 4618                LSR MAXHI
AB2 6617                ROR MAXLO
AB4 4618                LSR MAXHI
AB6 6617                ROR MAXLO
AB8 A518                LDA MAXHI
ABA C51A                CMP MINHI
ABC 9014                BCC CRATIO          IF MAX/8 HI IS LESS THAN MINHI
ABE D006                BNE LOWST6          IF MAX/8 HI IS GREATER
AC0 A517                LDA MAXLO           HI BYTES ARE EQUAL, CHECK LO
AC2 C519                CMP MINLO
AC4 900C                BCC CRATIO          IF MINLO IS LARGER THAN MAX/8 LO
AC6             ;
AC6 A614        LOWST6  LDX REFX            MARK THIS OFFSET AS INVALID
AC8 B567                LDA PERTBH,X
ACA 0980                ORA #$80
ACC 9567                STA PERTBH,X
ACE C602                DEC TBLPT
AD0 1093                BPL LOWST
AD2             ;
AD2             ;*************************************************************
AD2             ;       CALC RATIO = OFFSET / MIN AND PUT IN TABLE, THEN
AD2             ;       MARK THOSE OUT OF TOLERANCE USING B7 OF RANK TBL
AD2             ;*************************************************************
AD2             ;
AD2 A413        CRATIO  LDY LASTX
AD4 8402        CRAT1   STY TBLPT
AD6 B96700              LDA PERTBH,Y
AD9 3054                BMI CRAT4            IF INVALID OFFSET THEN RATIO=0
ADB 8508                STA OFFSTH
ADD B95700              LDA PERTBL,Y
AE0 8507                STA OFFSTL
AE2             ;
AE2             ;         CALC RATIO (MAX 7.968) :  CORLO = OFFST / MIN
AE2             ;            CORLO: HI 3 BITS = INT, LO 5 BITS = FRAC
AE2             ;
AE2 A900                LDA #0
AE4 A20E                LDX #9+5
AE6 8505                STA CORLO
AE8 8506                STA CORHI
AEA 18                  CLC
AEB             ;
AEB A508        RATIO1  LDA OFFSTH
AED 38                  SEC
AEE E519                SBC MINLO
AF0 A8                  TAY
AF1 A506                LDA CORHI
AF3 E51A                SBC MINHI
AF5 9005                BCC RATIO2
AF7 8506                STA CORHI
AF9 98                  TYA
AFA 8508                STA OFFSTH
```

```
AFC              ;
AFC 2605         RATIO2 ROL CORLO
AFE 0607                ASL OFFSTL
B00 2608                ROL OFFSTH
B02 2606                ROL CORHI
B04 CA                  DEX
B05 D0E4                BNE RATIO1
B07              ;
B07 A505                LDA CORLO
B09 A402                LDY TBLPT
B0B 992F00       CRAT2  STA RATIOT,Y
B0E              ;
B0E              ;      IS TOLERANCE WITHIN MINTOL & MAXTOL TABLE
B0E              ;
B0E 18                  CLC
B0F 6910                ADC #$10          OFFSET SO RATO => THAN INT VAL
B11 48                  PHA
B12 4A                  LSR A
B13 4A                  LSR A
B14 4A                  LSR A
B15 4A                  LSR A
B16 4A                  LSR A             PTR TO TOLERANCE TABLES
B17 AA                  TAX
B18 68                  PLA
B19 291F                AND #$1F          ISOLATE FRACTIONAL PART
B1B DD340B              CMP MINTOL,X
B1E 9005                BCC CRAT3         TOO LOW
B20 DD3C0B              CMP MAXTOL,X
B23 900A                BCC CRAT4         NOT TOO HIGH
B25              ;
B25 B96700       CRAT3  LDA PERTBH,Y      OUT OF TOL
B28 0980                ORA #$80
B2A 996700              STA PERTBH,Y
B2D C603                DEC ERRL          ONE LESS VALID DATA POINT
B2F              ;
B2F 88           CRAT4  DEY
B30 D0A2                BNE CRAT1
B32 F010                BEQ LEDCAL
B34              ;
B34 00100F0E MINTOL .BYTE 0,$10,$0F,$0E,$0E,$0E,$0E,$0E
B38 0E0E0E0E
B3C 00131517 MAXTOL .BYTE 0,$13,$15,$17,$19,$1B,$1D,$1F
B40 191B1D1F
B44              ;
B44              ;***************************************************************
B44              ;      CALC PERIOD OF ONE CYCCE OF INPUT
B44              ;***************************************************************
B44              ;
B44              ;      INIT
B44              ;
B44 A901         LEDCAL LDA #1
B46 8502                STA TBLPT         PTR TO PERIOD TBL
B48 A900                LDA #0
B4A 851B                STA OVERFL
B4C 851E                STA TOTALL
B4E 851F                STA TOTALH
B50 8520                STA NTOTAL
```

```
B52                 ;
B52 A402            LEDCA1 LDY TBLPT
B54 B96700                 LDA PERTBH,Y
B57 3050                   BMI LEDCA3        RATIO OUT OF TOL
B59 B92F00                 LDA RATIOT,Y
B5C 4A                     LSR A             RIGHT JUSTIFY THE INTEGER PART
B5D 4A                     LSR A
B5E 4A                     LSR A
B5F 4A                     LSR A
B60 18                     CLC
B61 6901                   ADC #1            ADD 1/2
B63 4A                     LSR A
B64 8509                   STA SIGLO
B66                 ;
B66 B95700                 LDA PERTBL,Y      SETUP FOR DIVIDE
B69 8505                   STA CORLO
B6B B96700                 LDA PERTBH,Y
B6E 8506                   STA CORHI
B70 A900                   LDA #0
B72 850A                   STA SIGHI
B74                 ;
B74                 ;          DIVIDISION:  BIN(16) = COR(16) / SIGLO(8)
B74                 ;
B74 A211                   LDX #17
B76 A900                   LDA #0
B78 851C                   STA BINLO
B7A 851D                   STA BINHI
B7C A509                   LDA SIGLO
B7E F029                   BEQ LEDCA3        IF /0 LET QUOTIENT = 0
B80                 ;
B80 A50A            DIV1   LDA SIGHI
B82 38                     SEC
B83 E509                   SBC SIGLO
B85 9002                   BCC DIV2
B87 850A                   STA SIGHI
B89                 ;
B89 261C            DIV2   ROL BINLO
B8B 261D                   ROL BINHI
B8D 2605                   ROL CORLO
B8F 2606                   ROL CORHI
B91 260A                   ROL SIGHI
B93 CA                     DEX
B94 D0EA                   BNE DIV1
B96                 ;
B96 18                     CLC
B97 A51C                   LDA BINLO
B99 651E                   ADC TOTALL        ADD RESULT TO TOTAL
B9B 851E                   STA TOTALL
B9D A51D                   LDA BINHI
B9F 651F                   ADC TOTALH
BA1 851F                   STA TOTALH
BA3 9002                   BCC LEDCA2
BA5 E61B                   INC OVERFL
BA7 E620            LEDCA2 INC NTOTAL
BA9                 ;
BA9 A502            LEDCA3 LDA TBLPT
BAB C513                   CMP LASTX
```

```
BAD 1005             BPL LEDCA4
BAF E602             INC TBLPT
BB1 4C520B           JMP LEDCA1
BB4                ;
BB4                ;       CALC OFFSET TOTAL / NTOTAL
BB4                ;
BB4 A520           LEDCA4 LDA NTOTAL
BB6 8509             STA SIGLO
BB8 A51E             LDA TOTALL
BBA 8505             STA CORLO
BBC A51F             LDA TOTALH
BBE 8506             STA CORHI
BC0 A51B             LDA OVERFL
BC2 850A             STA SIGHI
BC4                ;
BC4                ;       DIVISION WITH AUTO LEFT JUSTIFY
BC4                ;        BIN(16) = COR(16) / SIGLO(8)
BC4                ;
BC4 A2ED             LDX #-19
BC6 A900             LDA #0
BC8 851C             STA BINLO
BCA 851D             STA BINHI
BCC A509             LDA SIGLO
BCE F022             BEQ DVX          IF /0 LET QUOTIENT = 0
BD0                ;
BD0 A50A           DV1  LDA SIGHI
BD2 38               SEC
BD3 E509             SBC SIGLO
BD5 9002             BCC DV2
BD7 850A             STA SIGHI
BD9                ;
BD9 261C           DV2  ROL BINLO
BDB 261D             ROL BINHI
BDD 0605             ASL CORLO
BDF 2606             ROL CORHI
BE1 260A             ROL SIGHI
BE3 E8               INX
BE4                ;
BE4                ;       IF BELOW MINLIM LOOP TO JUSTIFY LEFT
BE4                ;
BE4 A51D             LDA BINHI
BE6 C962             CMP #>MINLIM
BE8 90E6             BCC DV1
BEA D006             BNE DVX
BEC A51C             LDA BINLO
BEE C947             CMP #<MINLIM
BF0 90DE             BCC DV1
BF2                ;
BF2 CA             DVX  DEX
BF3 8A               TXA
BF4 18               CLC
BF5 6523             ADC NEWOCT
BF7 8523             STA NEWOCT       # SHIFTS FOR LEFT JUSTIFY
BF9                ;
BF9                ;       CHECK SLOW / FAST SWITCH
BF9                ;
BF9 AD0002           LDA PORTA
```

```
BFC 2940               AND #$40
BFE D00B               BNE AVGCAL       SW = SLOW, DO AVG
C00             ;
C00 A51C               LDA BINLO        SW = FAST, NO AVG
C02 8528               STA AVGLO
C04 A51D               LDA BINHI
C06 8529               STA AVGHI
C08 4C670C             JMP KEYO
C0B             ;
C0B             ;      PERFORM AVERAGING
C0B             ;
C0B A526        AVGCAL LDA GCOUNT
C0D D00F               BNE AVG          BEYOND THE 1ST GOOD CORSUM
C0F A51C               LDA BINLO        ONLY INIT AVG, DON'T DISPLAY
C11 8528               STA AVGLO        USED IN AVG CALC
C13 8507               STA OFFSTL       USED TO CHK FOR CHANGE IN NOTE
C15 A51D               LDA BINHI
C17 8529               STA AVGHI
C19 8508               STA OFFSTH
C1B 4C9608      CALRTS JMP START
C1E             ;
C1E             ;      AVG = AVG + (BIN-AVG)/4
C1E             ;
C1E C901        AVG    CMP #1
C20 F004               BEQ AVG1         IF A NEW NOTE
C22 A904               LDA #4
C24 8524               STA NNEW         SET NOT NEW = 4
C26 38          AVG1   SEC
C27 A51C               LDA BINLO
C29 8507               STA OFFSTL       USED TO CHK FOR CHANGE IN NOTE
C2B E528               SBC AVGLO
C2D 851C               STA BINLO
C2F A51D               LDA BINHI
C31 8508               STA OFFSTH
C33 E529               SBC AVGHI
C35 851D               STA BINHI
C37 9017               BCC NEGAVG       NEG
C39             ;
C39 A51C               LDA BINLO        FIX ROUNDOFF SKEWING
C3B 6902               ADC #2
C3D 851C               STA BINLO
C3F A51D               LDA BINHI
C41 6900               ADC #0
C43 851D               STA BINHI
C45 461D               LSR BINHI        POS/4
C47 661C               ROR BINLO
C49 461D               LSR BINHI
C4B 661C               ROR BINLO
C4D 4C5A0C             JMP ADDAVG
C50             ;
C50 38          NEGAVG SEC              NEG/4
C51 661D               ROR BINHI
C53 661C               ROR BINLO
C55 38                 SEC
C56 661D               ROR BINHI
C58 661C               ROR BINLO
```

```
C5A                 ;
C5A 18              ADDAVG CLC
C5B A528                   LDA AVGLO
C5D 651C                   ADC BINLO
C5F 8528                   STA AVGLO
C61 A529                   LDA AVGHI
C63 651D                   ADC BINHI
C65 8529                   STA AVGHI
C67                 ;
C67                 ;      FIND KEY
C67                 ;
C67 A20C            KEY0   LDX #12
C69 A529            KEY1   LDA AVGHI
C6B CA              KEY2   DEX
C6C 30AD                   BMI CALRTS
C6E DD810C                 CMP KEYTBH,X
C71 90F8                   BCC KEY2
C73 D007                   BNE KEYX
C75 A528                   LDA AVGLO
C77 DD8D0C                 CMP KEYTBL,X
C7A 90ED                   BCC KEY1
C7C                 ;
C7C 8621            KEYX   STX NEWNOT
C7E 4C990C                 JMP ERRCAL
C81                 ;
C81 62686E74 KEYTBH .BYTE >25159,>26655,>28240,>29920,>31699,>33584
C85 7B83
C87 8A939CA5        .BYTE >35581,>37697,>39938,>42313,>44829,>47495
C8B AFB9
C8D
C8D 471F50E0 KEYTBL .BYTE <25159,<26655,<28240,<29920,<31699,<33584
C91 D330
C93 FD410249        .BYTE <35581,<37697,<39938,<42313,<44829,<47495
C97 1D87
C99                 ;
C99                 ;****************  CALC NOTE ERROR
C99                 ;
C99                 ;      SUB PERIOD VALUE FROM TBL VAL
C99                 ;
C99 38              ERRCAL SEC
C9A A621                   LDX NEWNOT
C9C A528                   LDA AVGLO
C9E FD8D0C                 SBC KEYTBL,X
CA1 8505                   STA CORLO
CA3 A529                   LDA AVGHI
CA5 FD810C                 SBC KEYTBH,X
CA8 8506                   STA CORHI
CAA                 ;
CAA A621                   LDX NEWNOT
CAC BD810C                 LDA KEYTBH,X
CAF 4A                     LSR A
CB0 850A                   STA SIGHI
CB2 BD8D0C                 LDA KEYTBL,X
CB5 6A                     ROR A
CB6 8509                   STA SIGLO
CB8                 ;
CB8                 ;      DIVISION  BIN(16) = COR(16) / SIG (16)
```

```
CB8                  ;
CB8 A20C                     LDX #12
CBA A900                     LDA #0
CBC 851C                     STA BINLO
CBE 851D                     STA BINHI
CC0                  ;
CC0 A505             DEV1    LDA CORLO
CC2 38                       SEC
CC3 E509                     SBC SIGLO
CC5 A8                       TAY
CC6 A506                     LDA CORHI
CC8 E50A                     SBC SIGHI
CCA 9004                     BCC DEV2
CCC 8506                     STA CORHI
CCE 8405                     STY CORLO
CD0                  ;
CD0 261C             DEV2    ROL BINLO
CD2 261D                     ROL BINHI
CD4 2605                     ROL CORLO
CD6 2606                     ROL CORHI
CD8 CA                       DEX
CD9 D0E5                     BNE DEV1
CDB                  ;
CDB A51C                     LDA BINLO
CDD A210                     LDX #16
CDF CA               ERRCA1  DEX
CE0 3007                     BMI ERRCAX
CE2 DDEC0C                   CMP ERRTBL,X
CE5 90F8                     BCC ERRCA1
CE7 8622                     STX NEWERR
CE9 4CFC0C           ERRCAX  JMP LITLED
CEC                  ;
CEC 00183D49         ERRTBL .BYTE   0, 24, 61, 73, 85, 97,107,114
CF0 55616B72
CF4 7A818892                .BYTE 122,129,136,146,158,170,183,219
CF8 9EAAB7DB
CFC                  ;
CFC                  ;************************  OUTPUT TO LED DISPLAY
CFC                  ;
CFC AD0002           LITLED LDA PORTA
CFF 2940                     AND #$40
D01 F03E                     BEQ LED1          SW = FAST - NOT AVGING
D03                  ;
D03                  ;       CHECK IF A NEW NOTE OR OCTAVE
D03                  ;
D03 A20C                     LDX #12
D05 A508             NKEY1   LDA OFFSTH
D07 CA               NKEY2   DEX
D08 301A                     BMI CHANGE
D0A DD810C                   CMP KEYTBH,X
D0D 90F8                     BCC NKEY2
D0F D007                     BNE NKEYX
D11 A507                     LDA OFFSTL
D13 DD8D0C                   CMP KEYTBL,X
D16 90ED                     BCC NKEY1
D18                  ;
D18 E421             NKEYX   CPX NEWNOT
```

```
D1A D008            BNE CHANGE     NOTE CHANGED
D1C               ;
D1C A523            LDA NEWOCT
D1E C525            CMP LSTOCT
D20 F01F            BEQ LED1       OCT NOT CHANGED
D22 8525            STA LSTOCT
D24               ;
D24 A521          CHANGE LDA NEWNOT
D26 A507            LDA OFFSTL     RE-INIT AVG VAL
D28 8528            STA AVGLO
D2A A508            LDA OFFSTH
D2C 8529            STA AVGHI
D2E A901            LDA #1
D30 8526            STA GCOUNT
D32 C624            DEC NNEW
D34 1008            BPL LED0
D36 AD0002          LDA PORTA      IF NOTES CHANGE RAPIDLY ...
D39 0910            ORA #$10       TURN OFF DISPLAY
D3B 8D0002          STA PORTA
D3E 4C9608        LED0   JMP START
D41               ;
D41               ;      DIPLAY NOTE
D41               ;
D41 A521          LED1   LDA NEWNOT
D43 18              CLC
D44 69F4            ADC #$F4
D46 49FF            EOR #$FF
D48 290F            AND #$0F
D4A 8521            STA NEWNOT
D4C AD0002          LDA PORTA
D4F 29F0            AND #$F0
D51 0521            ORA NEWNOT
D53 8D0002          STA PORTA
D56               ;
D56               ;      DISPLAY ERROR
D56               ;
D56 A522          DSPERR LDA NEWERR
D58 290F            AND #$F
D5A 4A              LSR A
D5B 8522            STA NEWERR
D5D               ;
D5D AD0002          LDA PORTA      SET LSB
D60 9005            BCC DSPER1
D62 29DF            AND #$DF
D64 4C690D          JMP DSPER2
D67 0920          DSPER1 ORA #$20
D69 8D0002        DSPER2 STA PORTA
D6C               ;
D6C AD0202          LDA PORTB
D6F 29F8            AND #$F8
D71 0522            ORA NEWERR
D73 8D0202          STA PORTB
D76               ;
D76               ;      DISPLAY OCTAVE
D76               ;
D76 A623            LDX NEWOCT
D78 E002            CPX #2
```

```
1074    D7A 1007             BPL FIL1          PITCH > 130 Hz, USE HP FILTER
1075    D7C AD0002           LDA PORTA
1076    D7F 0980             ORA #$80          ELSE USE LP
1077    D81 D005             BNE FIL2
1078    D83 AD0002   FIL1    LDA PORTA
1079    D86 297F             AND #$7F
1080    D88 8D0002   FIL2    STA PORTA
1081    D8B 8A               TXA
1082    D8C 2907             AND #7
1083    D8E 18               CLC
1084    D8F 6901             ADC #1
1085    D91 C904             CMP #4
1086    D93 F008             BEQ LED3          = MIDDLE C OCTAVE
1087    D95 B002             BCS LED2          ABOVE
1088    D97 6901             ADC #1            BELOW
1089    D99 2907     LED2    AND #7
1090    D9B D002             BNE LED4
1091    D9D A900     LED3    LDA #0
1092    D9F 0A       LED4    ASL A
1093    DA0 0A               ASL A
1094    DA1 0A               ASL A
1095    DA2 4938             EOR #$38
1096    DA4 8523             STA NEWOCT
1097    DA6 AD0202           LDA PORTB
1098    DA9 29C7             AND #$C7
1099    DAB 0523             ORA NEWOCT
1100    DAD 8D0202           STA PORTB
1101    DB0                  ;
1102    DB0 AD0002   DISPEN LDA PORTA          ENABLE THE DISPLAY
1103    DB3 29EF             AND #$EF
1104    DB5 8D0002           STA PORTA
1105    DB8                  ;
1106    DB8 4C9608           JMP START
1107    DBB                  ;
1108    DBB                  .END

   0 ERRORS
1473 BYTES
1108 LINES
4434 OF  4608 BYTES OF SYMBOLS

SYMBOL   VALUE   DEF LINE   CROSS REFERENCES

 ADDAVG   C5A      910      901
 AVG      C1E      876      865
 AVG1     C26      880      877
 AVGCAL   C0B      864      854
 AVGHI     29       93      859   870   887   914   916   921   949   1028
 AVGLO     28       92      857   867   883   911   913   927   946   1026
 BEGINN    11       61      338   563
 BGNTBL    15       65      331   345   354   561
 BINHI     1D       75      765   776   787   817   828   836   850   869
                            885   888   894   896   897   899   904   907
                            915   966   979
 BINLO     1C       74      764   775   784   816   827   840   856   866
                            881   884   891   893   898   900   905   908
                            912   965   978   985
 CALRTS   C1B      872      923
```

| | | | | | | | | | | |
|---|---|---|---|---|---|---|---|---|---|---|
| CHANGE | D24 | 1024 | 1008 | 1017 | | | | | | |
| CORCAL | 977 | 407 | 508 | | | | | | | |
| CORCL3 | 9A0 | 437 | 421 | | | | | | | |
| CORCL4 | 9C6 | 465 | 452 | | | | | | | |
| CORCL5 | 9C7 | 470 | 461 | | | | | | | |
| CORCL6 | 9E8 | 493 | 482 | | | | | | | |
| CORCL7 | 9F5 | 503 | 491 | | | | | | | |
| CORCLX | 98D | 425 | 416 | 418 | | | | | | |
| CORCNT | 16 | 66 | 348 | 553 | | | | | | |
| COREND | A44 | 559 | 369 | 554 | | | | | | |
| COREX3 | 931 | 345 | 565 | | | | | | | |
| COREXC | 8C9 | 280 | 182 | | | | | | | |
| CORHI | 6 | 50 | 202 | 207 | 221 | 226 | 357 | 488 | 490 | 497 |
| | | | 499 | 512 | 533 | 671 | 678 | 681 | 688 | 756 |
| | | | 778 | 807 | 830 | 951 | 972 | 975 | 981 | |
| CORLA3 | 950 | 372 | 367 | | | | | | | |
| CORLAT | 939 | 354 | 567 | | | | | | | |
| CORLAX | 94D | 369 | 364 | 373 | 376 | | | | | |
| CORLO | 5 | 49 | 206 | 212 | 220 | 356 | 485 | 487 | 494 | 496 |
| | | | 537 | 670 | 685 | 692 | 754 | 777 | 805 | 829 |
| | | | 948 | 968 | 976 | 980 | | | | |
| CORT01 | A27 | 542 | 534 | | | | | | | |
| CORT02 | A40 | 556 | 513 | 535 | 538 | | | | | |
| CORT04 | A51 | 567 | 557 | | | | | | | |
| CORTOT | A00 | 512 | 433 | | | | | | | |
| CORVAL | 12 | 62 | 411 | 481 | | | | | | |
| CORX1 | 8F7 | 301 | 299 | 314 | | | | | | |
| CORX2 | 907 | 309 | 313 | | | | | | | |
| CORX3 | 912 | 316 | 307 | | | | | | | |
| CORXA | 8EC | 296 | 282 | | | | | | | |
| COUNT | 8B7 | 256 | 257 | 262 | | | | | | |
| COUNT1 | 8BD | 260 | | | | | | | | |
| COUNTX | 8C1 | 266 | 259 | | | | | | | |
| CRAT1 | AD4 | 658 | 720 | | | | | | | |
| CRAT2 | B0B | 694 | | | | | | | | |
| CRAT3 | B25 | 714 | 710 | | | | | | | |
| CRAT4 | B2F | 719 | 660 | 712 | | | | | | |
| CRATIO | AD2 | 657 | 639 | 643 | | | | | | |
| DDRA | 201 | 26 | 196 | | | | | | | |
| DDRB | 203 | 32 | 194 | | | | | | | |
| DELAIN | 10 | 60 | 336 | 556 | 560 | | | | | |
| DEV1 | CC0 | 968 | 983 | | | | | | | |
| DEV2 | CD0 | 978 | 974 | | | | | | | |
| DISPEN | DB0 | 1102 | | | | | | | | |
| DIV1 | B80 | 769 | 781 | | | | | | | |
| DIV2 | B89 | 775 | 772 | | | | | | | |
| DSPER1 | D67 | 1062 | 1059 | | | | | | | |
| DSPER2 | D69 | 1063 | 1061 | | | | | | | |
| DSPERR | D56 | 1053 | | | | | | | | |
| DV1 | BD0 | 821 | 838 | 842 | | | | | | |
| DV2 | BD9 | 827 | 824 | | | | | | | |
| DVX | BF2 | 844 | 819 | 839 | | | | | | |
| ENDMRK | FF | 114 | 177 | 268 | 298 | 366 | 375 | 420 | | |
| ERRCA1 | CDF | 987 | 990 | | | | | | | |
| ERRCAL | C99 | 944 | 932 | | | | | | | |
| ERRCAX | CE9 | 992 | 988 | | | | | | | |
| ERRH | 4 | 45 | 155 | 165 | 166 | | | | | |

| | | | | | | | | | |
|---|---|---|---|---|---|---|---|---|---|
| ERRL | 3 | 44 | 152 | 162 | 163 | 544 | 717 | | |
| ERRTBL | CEC | 994 | 989 | | | | | | |
| FIL1 | D83 | 1078 | 1074 | | | | | | |
| FIL2 | D88 | 1080 | 1077 | | | | | | |
| GCOUNT | 26 | 90 | 284 | 296 | 864 | 1030 | | | |
| INCCOR | 14 | 109 | 161 | | | | | | |
| INIT | 840 | 189 | 11 | 12 | | | | | |
| INIT1 | 864 | 205 | 229 | | | | | | |
| INIT2 | 867 | 206 | 218 | | | | | | |
| INIT3 | 86E | 210 | 211 | 213 | | | | | |
| INIT4 | 87D | 219 | 203 | | | | | | |
| INIT5 | 88A | 226 | 224 | | | | | | |
| INITX | 891 | 231 | | | | | | | |
| INTRP1 | 80E | 134 | 128 | | | | | | |
| INTRP2 | 814 | 141 | 132 | | | | | | |
| INTRPT | 800 | 125 | 13 | | | | | | |
| INTRPX | 841 | 176 | 157 | | | | | | |
| INTRX1 | 847 | 179 | 169 | | | | | | |
| IO | 200 | 19 | 20 | 26 | 28 | 32 | | | |
| KEY0 | C67 | 920 | 860 | | | | | | |
| KEY1 | C69 | 921 | 929 | | | | | | |
| KEY2 | C6B | 922 | 925 | | | | | | |
| KEYTBH | C81 | 934 | 924 | 950 | 954 | 1009 | | | |
| KEYTBL | C8D | 937 | 928 | 947 | 957 | 1013 | | | |
| KEYX | C7C | 931 | 926 | | | | | | |
| LASTDL | F | 59 | 346 | 358 | 378 | | | | |
| LASTHI | E | 58 | 398 | 475 | 476 | 489 | 498 | 506 | |
| LASTLO | D | 57 | 396 | 472 | 473 | 486 | 495 | 504 | |
| LASTX | 13 | 63 | 543 | 584 | 592 | 657 | 795 | | |
| LED0 | D3E | 1036 | 1032 | | | | | | |
| LED1 | D41 | 1040 | 1001 | 1021 | | | | | |
| LED2 | D99 | 1089 | 1087 | | | | | | |
| LED3 | D9D | 1091 | 1086 | | | | | | |
| LED4 | D9F | 1092 | 1090 | | | | | | |
| LEDCA1 | B52 | 740 | 798 | | | | | | |
| LEDCA2 | BA7 | 792 | 790 | | | | | | |
| LEDCA3 | BA9 | 794 | 742 | 767 | | | | | |
| LEDCA4 | BB4 | 802 | 796 | | | | | | |
| LEDCAL | B44 | 732 | 721 | | | | | | |
| LITLED | CFC | 999 | 992 | | | | | | |
| LOWEST | A5D | 582 | 552 | 573 | | | | | |
| LOWST | A65 | 586 | 650 | | | | | | |
| LOWST0 | A73 | 596 | 627 | | | | | | |
| LOWST1 | A88 | 606 | 599 | | | | | | |
| LOWST2 | A90 | 613 | 601 | 603 | 605 | | | | |
| LOWST3 | AA3 | 622 | 616 | | | | | | |
| LOWST4 | AA9 | 626 | 597 | 615 | 619 | 621 | | | |
| LOWST6 | AC6 | 645 | 640 | | | | | | |
| LSTOCT | 25 | 89 | 1020 | 1022 | | | | | |
| MAXCOR | 4 | 113 | 347 | | | | | | |
| MAXHI | 18 | 69 | 591 | 614 | 622 | 631 | 633 | 635 | 637 |
| MAXLO | 17 | 68 | 590 | 618 | 620 | 624 | 632 | 634 | 636 | 641 |
| MAXTOL | B3C | 724 | 711 | | | | | | |
| MINHI | 1A | 71 | 588 | 598 | 606 | 638 | 679 | | |
| MINLIM | 6247 | 115 | 837 | 841 | | | | | |
| MINLO | 19 | 70 | 587 | 602 | 604 | 608 | 642 | 676 | |
| MINTOL | B34 | 723 | 709 | | | | | | |

| | | | | | | | | | | |
|---|---|---|---|---|---|---|---|---|---|---|
| NBEGIN | 4 | 112 | 330 | 337 | | | | | | |
| NDELAY | 6 | 111 | 335 | 559 | | | | | | |
| NEGAVG | C50 | 903 | 889 | | | | | | | |
| NEWERR | 22 | 83 | 791 | 1053 | 1056 | 1067 | | | | |
| NEWNOT | 21 | 82 | 931 | 945 | 953 | 1016 | 1024 | 1040 | 1045 | 1048 |
| NEWOCT | 23 | 84 | 308 | 847 | 848 | 1019 | 1072 | 1096 | 1099 | |
| NKEY1 | D05 | 1006 | 1014 | | | | | | | |
| NKEY2 | D07 | 1007 | 1010 | | | | | | | |
| NKEYX | D18 | 1016 | 1011 | | | | | | | |
| NNEW | 24 | 88 | 879 | 1031 | | | | | | |
| NTOTAL | 20 | 78 | 738 | 792 | 802 | | | | | |
| OFFDSP | 8CF | 283 | 304 | 574 | | | | | | |
| OFFSTH | 8 | 52 | 391 | 442 | 547 | 661 | 674 | 683 | 687 | 871 |
| | | | 886 | 1006 | 1027 | | | | | |
| OFFSTL | 7 | 51 | 212 | 216 | 387 | 439 | 545 | 663 | 686 | 868 |
| | | | 882 | 1012 | 1025 | | | | | |
| OVERFL | 18 | 72 | 735 | 791 | 808 | | | | | |
| PCOUNT | 27 | 91 | 288 | 290 | 583 | | | | | |
| PERTBH | 67 | 102 | 323 | 548 | 596 | 613 | 646 | 648 | 659 | 714 |
| | | | 716 | 741 | 755 | | | | | |
| PERTBL | 57 | 101 | 324 | 546 | 601 | 607 | 617 | 623 | 662 | 753 |
| PORTA | 200 | 20 | 205 | 232 | 285 | 287 | 291 | 293 | 852 | 999 |
| | | | 1033 | 1035 | 1046 | 1049 | 1058 | 1063 | 1075 | 1078 |
| | | | 1080 | 1102 | 1104 | | | | | |
| PORTB | 202 | 28 | 130 | 134 | 143 | 208 | 244 | 247 | 1065 | 1068 |
| | | | 1097 | 1100 | | | | | | |
| RATIO1 | AEB | 674 | 690 | | | | | | | |
| RATIO2 | AFC | 685 | 680 | | | | | | | |
| RATIOT | 2F | 104 | 694 | 743 | | | | | | |
| REFX | 14 | 64 | 609 | 645 | | | | | | |
| SIGHI | A | 54 | 389 | 431 | 432 | 517 | 518 | 521 | 528 | 529 |
| | | | 758 | 769 | 773 | 779 | 809 | 821 | 825 | 831 |
| | | | 956 | 973 | | | | | | |
| SIGLO | 9 | 53 | 385 | 428 | 429 | 519 | 520 | 522 | 525 | 526 |
| | | | 536 | 751 | 766 | 771 | 803 | 818 | 823 | 959 |
| | | | 970 | | | | | | | |
| START | 896 | 234 | 289 | 294 | 872 | 1036 | 1106 | | | |
| START1 | 89F | 240 | 242 | | | | | | | |
| TBLLEN | 14 | 110 | 248 | 281 | 312 | 330 | | | | |
| TBLPT | 2 | 43 | 144 | 168 | 249 | 267 | 280 | 300 | 301 | 340 |
| | | | 542 | 550 | 571 | 585 | 649 | 658 | 693 | 733 |
| | | | 740 | 794 | 797 | | | | | |
| TIMEHI | C | 56 | 443 | 450 | 460 | 474 | 505 | | | |
| TIMELO | B | 55 | 440 | 448 | 458 | 471 | 503 | | | |
| TIMTBH | 43 | 99 | 156 | 178 | 269 | 297 | 303 | 306 | 311 | 316 |
| | | | 365 | 374 | 388 | 390 | 397 | 419 | 430 | 441 |
| | | | 451 | 459 | | | | | | |
| TIMTBL | 2F | 98 | 153 | 302 | 305 | 310 | 317 | 384 | 386 | 395 |
| | | | 427 | 438 | 449 | 457 | | | | |
| TOTALH | 1F | 77 | 737 | 788 | 789 | 806 | | | | |
| TOTALL | 1E | 76 | 736 | 785 | 786 | 804 | | | | |
| VALID | A54 | 571 | 564 | | | | | | | |
| ITEMP | 0 | 41 | 131 | 135 | 170 | 407 | 409 | | | |
| IVAL | 1 | 42 | 141 | 154 | | | | | | |
| Z | 0 | 37 | 41 | 42 | 43 | 44 | 45 | 49 | 50 | 51 |
| | | | 52 | 53 | 54 | 55 | 56 | 57 | 58 | 59 |

60 61 62 63 64 65 66 68
69 70 71 72 74 75 76 77
78 82 83 84 88 89 90 91
92 93 240
ZFERTB 91A 323 326

I claim:

1. A device for determining the pitch of an audio input signal comprising:

means responsive to said audio input signal for generating a reference waveform having transitions corresponding to the zero crossings of said audio input signal whereupon said reference waveform includes a first transition of a given sense and a plurality of succeeding transitions of the same given sense at a corresponding plurality of time intervals relative to said first transition;

means for determining the correlation between said reference waveform and each of a plurality of effectively delayed waveforms, each of which corresponds to said reference waveform delayed by one of said time intervals;

means for selecting a subset of said plurality of time intervals, each member of which yields an effectively delayed waveform having a correlation above a predetermined threshold; and means responsive to said subset of time intervals for determining a characteristic period for said reference waveform.

2. The invention of claim 1, and further comprising means for displaying an indication of said characteristic period.

3. The invention of claim 2, wherein said displaying means comprises:

a first plurality of indicators corresponding to musical notes within an octave;

a second plurality of indicators representative of octave displacement from the notes corresponding to said first plurality of indicators; and a third plurality of indicators representative of deviations from a set of reference pitches;

whereupon pitch is displayed by note, octave displacement, and error.

4. The invention of claim 1, and further comprising a microphone for converting sound incident thereon into an electrical signal to provide said audio input signal.

5. The invention of claim 1 wherein said reference waveform is a two-state signal, and wherein the correlation between said reference waveform and one of said effectively delayed waveforms is representative of the fraction of time said reference waveform and said one of said effectively delayed waveforms have the same polarity.

6. The invention of claim 1 wherein said means for determining the correlation comprises:

a programmed microcomputer;

memory means associated with said microcomputer;

means associated with said microcomputer and responsive to said reference waveform for generating a list of time values corresponding to the reference waveform transitions of sad given sense; and means associated with said microcomputer for storing said list of time values in said memory means.

7. The invention of claim 6 wherein said list generating means also operates to generate the time values corresponding to the reference waveform transitions of a sense opposite to said given sense.

8. The invention of claim 6 wherein said means for generating a list comprises:

means for generating a pulse at each transition of said reference waveform;

means for communicating said pulse to an interrupt input on said microcomputer;

a counter whose content is representative of elapsed time; and means for storing the value of said counter upon the occurrence of a pulse at said interrupt input.

9. The invention of claim 8 wherein said means for generating a pulse comprises:

an output latch associated with said microcomputer and having an output terminal; and an exclusive OR gate having a first input to which is communicated said reference signal and a second input to which is communicated said output terminal of said output latch;

said microcomputer operating to change the state of said output latch upon the occurrence of a particular level at the output of said exclusive OR gate, whereupon said exclusive OR gate output provides a pulse at each zero crossing of said reference signal.

10. The invention of claim 1, and further comprising filtering means for removing frequency components of said electrical signal having frequencies outside a frequency range of interest.

11. A device for determining the pitch of an audio input signal comprising:

means responsive to said audio input signal for storing a reference waveform which is a representation of said audio input signal, said reference waveform having transitions corresponding to the zero crossings of said audio input signal whereupon said reference waveform includes a first transition of a given sense and a plurality of succeeding transitions of the same given sense at a corresponding plurality of time intervals relative to said first transition;

means for determining at least one of said time intervals which yields a correlation between said reference waveform and a waveform corresponding to said reference waveform delayed by said time interval over a common time span which is above a threshold value;

means for determining on the basis of said at least one time interval a characteristic period for said reference waveform.

12. The invention of claim 11 wherein said reference waveform is a two-state waveform having transitions corresponding to the zero crossings of said audio input signal.

13. A device for determining the pitch of an audio input signal comprising:

means responsive to said audio input signal for generating a two-state reference waveform with transitions corresponding to the zero crossings of said audio input signal whereupon said reference waveform includes a first transition of a given sense and a plurality of succeeding transitions of the same given sense at a corresponding plurality of time intervals relative to said first transition;

memory means;

means for storing in said memory means a sequence of numerical representations of the times of transition of said reference waveform;

means for determining a corresponding plurality of correlation values, each of which is determined by the percentage of time that the reference waveform has the same polarity as an effectively delayed waveform corresponding to said reference waveform delayed by the corresponding one of said time intervals;

means for selecting a subset of said plurality of time intervals, each member of which yields an effectively delayed waveform having a correlation above a predetermined threshold; and means responsive to said subset of time intervals for determining a characteristic period for said reference waveform.

14. A method foe determining the pitch of an audio input signal comprising:

converting said audio input signal into a two-state reference waveform having transitions corresponding to the zero crossings of said audio input signal whereupon said reference waveform includes a first transition of a given sense and a plurality of succeeding transitions of the same given sense at a corresponding plurality of time intervals relative to said first transition;

generating a list of values representative of the reference waveform transition times;

determining the correlation between said reference waveform and a plurality of effectively delayed waveforms each of which corresponds to said reference waveform delayed by the corresponding one of said time intervals;

selecting a subset of said plurality of time intervals, each member of which yields an effectively delayed waveform having a correlation above a predetermined threshold; and determining a characteristic period from said subset of time intervals.

15. The invention of claim 14 wherein said step of determining the characteristic period comprises the substeps of:

selecting the smallest value of said subset of time intervals that is at least a given fraction of the largest value of said subset;

rejecting those members of said subset which have values that are farther than a predetermined amount from being an integer multiple of the shortest delay time;

dividing each valid delay time by the nearest exact integer to normalize each delay time to represent one cycle time; and averaging the normalized cycle times to provide the pitch.

* * * * *